(12) United States Patent
Qi et al.

(10) Patent No.: US 12,514,041 B2
(45) Date of Patent: Dec. 30, 2025

(54) DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Qi Qi, Beijing (CN); Jian Xu, Beijing (CN); Wanzhi Chen, Beijing (CN); Xinxin Zhao, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 461 days.

(21) Appl. No.: 18/247,331

(22) PCT Filed: Mar. 3, 2022

(86) PCT No.: PCT/CN2022/079107
§ 371 (c)(1),
(2) Date: Mar. 30, 2023

(87) PCT Pub. No.: WO2023/123656
PCT Pub. Date: Jul. 6, 2023

(65) Prior Publication Data
US 2024/0363814 A1    Oct. 31, 2024

(30) Foreign Application Priority Data
Dec. 31, 2021   (CN) .................. 202111649830.3

(51) Int. Cl.
G02B 5/02       (2006.01)
H01L 25/16      (2023.01)
H10H 20/856     (2025.01)

(52) U.S. Cl.
CPC ......... *H10H 20/856* (2025.01); *G02B 5/0242* (2013.01); *G02B 5/0278* (2013.01); *H01L 25/167* (2013.01)

(58) Field of Classification Search
CPC .................. G02F 1/133603; G02F 1/133613
See application file for complete search history.

(56) References Cited

U.S. PATENT DOCUMENTS 9,122,094 B2 * 9/2015 Fujiwara ........... G02F 1/133603
10,067,385 B2 * 9/2018 Jeon .................. G02F 1/133603
(Continued)

FOREIGN PATENT DOCUMENTS

CN    210573097 U    5/2020
CN    113221702 A    8/2021
(Continued)

OTHER PUBLICATIONS

Extended European Search Report from Application No. 22912962. 2; Mailing Date : Oct. 7, 2024.
(Continued)

*Primary Examiner* — Eric T Eide
(74) *Attorney, Agent, or Firm* — Dilworth & Barrese, LLP.; Michael J. Musella, Esq.

(57) ABSTRACT

A display device includes a display panel and a light-emission board which includes a base substrate and light-emission units, and a maximum size of the light-emission unit in a direction parallel to the base substrate is not greater than 3 mm; connecting lines of centers of four immediately adjacent light-emission units define a quadrangle; a connecting line of centers of two light-emission units that define the quadrangle and have a largest distance therebetween passes through two first points in edges, close to each other, of the two light-emission units; a distance between the two first points is a first distance D1; an included angle between
(Continued)

an outermost light ray of light rays emitted by the light-emission unit and a plane parallel to the base substrate is θ; and a minimum distance between surfaces, close to each other, of the display panel and the base substrate is not less than D1*tan θ/2.

20 Claims, 10 Drawing Sheets

(56) References Cited

U.S. PATENT DOCUMENTS

| | | | |
|---|---|---|---|
| 10,921,642 B2* | 2/2021 | Qiu | ............... H05K 1/181 |
| 2005/0169007 A1* | 8/2005 | Chou | ............. G02F 1/133603 |
| | | | 362/555 |
| 2006/0012993 A1* | 1/2006 | Ohkawa | ........... G02F 1/133603 |
| | | | 362/240 |
| 2009/0185371 A1* | 7/2009 | Peng | ............. G02F 1/133611 |
| | | | 362/235 |
| 2009/0316386 A1* | 12/2009 | Yun | ............. G02F 1/133603 |
| | | | 362/249.06 |
| 2010/0061087 A1* | 3/2010 | Stevens | ............ G02F 1/133605 |
| | | | 362/97.3 |
| 2013/0155351 A1 | 6/2013 | Garelli et al. | |
| 2018/0239195 A1 | 8/2018 | Kumamoto et al. | |
| 2019/0285941 A1 | 9/2019 | Liu et al. | |
| 2020/0081298 A1 | 3/2020 | Liao et al. | |
| 2021/0223624 A1 | 7/2021 | Zhang et al. | |
| 2021/0271133 A1 | 9/2021 | Zhang et al. | |
| 2021/0375969 A1 | 12/2021 | Wu et al. | |
| 2021/0399056 A1 | 12/2021 | Wang et al. | |

FOREIGN PATENT DOCUMENTS

| | | |
|---|---|---|
| CN | 113534537 A | 10/2021 |
| CN | 114005850 A | 2/2022 |
| WO | 2021035531 A1 | 3/2021 |

OTHER PUBLICATIONS

International Search Report for PCT application PCT/CN2022/079107, mailing date is Aug. 25, 2022.

* cited by examiner (a)

(b)

DISPLAY DEVICE

CROSS-REFERENCE TO RELATED APPLICATION

The present application claims priority of the Chinese Patent Application No. 202111649830.3 filed on Dec. 31, 2021, the disclosure of which is incorporated herein by its reference in its entirety as part of the present application.

TECHNICAL FIELD

At least one embodiment of the present disclosure provides a display device.

BACKGROUND

Display system has increasingly high requirements for properties such as pixels per inch (PPI), resolution and high dynamic range (HDR). In order to keep a liquid crystal display to be competitive, a size of a light-emission diode (LED) serving as a backlight source of the liquid crystal display is getting smaller and smaller, which is helpful to improve the display properties.

A mini light-emission diode (mini LED) or a micro light-emission diode (micro LED) may serve as the backlight source of the liquid crystal display. In the case that the mini LED or micro LED serving as the backlight source is combined with a traditional liquid crystal display panel, a liquid crystal display device may be allowed to have a high contrast comparable to that of an organic light-emission diode display device by controlling the brightness of the mini LED or micro LED to match with the grayscale presented by the display panel.

SUMMARY

At least one embodiment of the disclosure provides a display device.

At least one embodiment of the disclosure provides a display device, and the display device comprises: a display panel; and a light-emission board located on a non-display side of the display panel and stacked with the display panel. The light-emission board comprises a base substrate and a plurality of light-emission units provided on the base substrate, and a maximum size of at least one light-emission unit in a direction parallel to the base substrate is not greater than 3 mm. Connecting lines of centers of four immediately adjacent light-emission units in the plurality of light-emission units define a quadrangle; any two of the four light-emission units are immediately adjacent to each other; a connecting line of centers of two light-emission units that define the quadrangle and have a largest distance therebetween passes through two first points in edges, close to each other, of the two light-emission units; a distance between the two first points is a first distance D1; an included angle between an outermost light ray of light rays emitted by one of the light-emission units and a plane parallel to the base substrate is $\theta$; and a minimum distance between surfaces, close to each other, of the display panel and the base substrate is not less than $D1*\tan \theta/2$.

For example, according to at least one embodiment of the disclosure, the quadrangle comprises a parallelogram.

For example, according to at least one embodiment of the disclosure, at least part of the plurality of light-emission units are arranged in an array in a first direction and a second direction that intersects the first direction; connecting lines of centers of two adjacent light-emission units arranged in the first direction and two light-emission units respectively adjacent to, the two adjacent light-emission units arranged in the first direction, in the second direction define the quadrangle, and an included angle between an edge of the quadrangle and the first direction or the second direction has a value in the range of $-20°$ to $20°$.

For example, according to at least one embodiment of the disclosure, the display device further comprises: a light diffusion structure located between the light-emission board and the display panel and having a thickness of less than $D1*\tan \theta/2$ in a direction perpendicular to the base substrate. The light diffusion structure is spaced apart from the light-emission board; a line of the light-emission unit truncated by an extension line of a connecting line of the two first points has a size of L; a distance between a surface on a side, facing the light-emission board, of the light diffusion structure and a surface, facing the base substrate, of the light-emission unit is a second distance D2, and the second distance D2 meets: $D1*\tan \theta/2 < D2 < [(3*D1+2L)*\tan \theta]/2$.

For example, according to at least one embodiment of the disclosure, the display device further comprises: a light diffusion structure located between the light-emission board and the display panel and in direct contact with at least part of the light-emission units. The light-emission unit has a thickness H1 in a direction perpendicular to the base substrate, and a thickness H2 of the light diffusion structure meets: $D1*\tan \theta/2 - H1 \leq H2 \leq 5$ mm.

For example, according to at least one embodiment of the disclosure, the light-emission unit comprises an unencapsulated light-emission diode chip that has a maximum size of not greater than 500 μm in the direction parallel to the base substrate.

For example, according to at least one embodiment of the disclosure, a protective layer is provided on a side, facing the display panel, of the plurality of light-emission units.

For example, according to at least one embodiment of the disclosure, the light-emission unit comprises a light-emission diode chip and an encapsulation structure configured to encapsulate the light-emission diode chip; and a gap is provided between the encapsulation structures of adjacent light-emission units.

For example, according to at least one embodiment of the disclosure, the light-emission board comprises a first region and a second region located at a periphery of the first region; the light-emission units located in the first region are arranged in an array; in the second region, a connecting line of centers of one light-emission unit and any light-emission unit adjacent to the one light-emission unit passes through two second points in edges, close to each other, of the two light-emission units; and a distance between the two second points is smaller than the first distance.

For example, according to at least one embodiment of the disclosure, a ratio of the distance between the two second points in the second region to the first distance is 0.6 to 0.9.

For example, according to at least one embodiment of the disclosure, the light-emission board comprises a plurality of light-emission-unit rows, each of which comprises at least two light-emission units arranged in the first direction; the plurality of light-emission-unit rows are arranged in a direction perpendicular to the first direction; the first distance between the two light-emission units in an outermost light-emission-unit row and a light-emission-unit row adjacent to the outermost light-emission-unit row is smaller than the first distance between the two light-emission units in other two adjacent light-emission-unit rows; and/or the light-emission board comprises a plurality of light-emission-unit columns, each of which comprises at least two light-emission units arranged in the second direction; the plurality of light-emission-unit columns are arranged in a direction perpendicular to the second direction; the first distance between the two light-emission units in an outermost light-emission-unit column and a light-emission-unit column adjacent to the outermost light-emission-unit column is smaller than the first distance between the two light-emission units in other two adjacent light-emission-unit columns.

For example, according to at least one embodiment of the disclosure, a distance by which a connecting line of centers of any two adjacent light-emission units passes through two points in edges, close to each other, of the any two adjacent light-emission units is not smaller than a minimum distance between the light-emission unit that is outermost on the light-emission board and an edge of the light-emission board.

For example, according to at least one embodiment of the disclosure, a plurality of support portions are provided between the light-emission board and the light diffusion structure; connecting lines of the plurality of support portions define at least a first polygon and a second polygon parallel to the base substrate; the second polygon surrounds the first polygon; the first polygon comprises a plurality of first diagonal lines, while the second polygon comprises a plurality of second diagonal lines; at least two of the plurality of first diagonal lines pass through a geometrical center of the light-emission board, and/or at least two of the plurality of second diagonal lines pass through the geometrical center of the light-emission board.

For example, according to at least one embodiment of the disclosure, a thickness of the support portion in the direction perpendicular to the base substrate is smaller than the second distance.

For example, according to at least one embodiment of the disclosure, a value of θ ranges from 20° to 30°, and a value of D1/L is 3 to 10.

For example, according to at least one embodiment of the disclosure, the value of θ ranges from 10° to 25°, and the value of D1/L is 5 to 11.

For example, according to at least one embodiment of the disclosure, the light diffusion structure comprises a plurality of layers; an area of one of the plurality of layers is S0, and an area of the first polygon is S1; and S0 and S1 meet: S0/S1≥16.

For example, according to at least one embodiment of the disclosure, the light diffusion structure comprises a plurality of layers; an area of one of the plurality of layers is S0, and an area of the second polygon is S2; and S0 and S2 meet: S0/S2≥2.

For example, according to at least one embodiment of the disclosure, a planar shape, parallel to the base substrate, of the display panel is a quadrangle; the planar shape of the display panel comprises two long edges and two short edges that are connected alternately; an included angle between the longest one of the first diagonal lines passing through the geometrical center of the light-emission board and a straight line parallel to the long edges is a first included angle; and the first included angle is the smallest one of a plurality of included angles between the first diagonal lines passing through the geometrical center of the light-emission board and the straight line.

For example, according to at least one embodiment of the disclosure, an included angle between the shortest one of the first diagonal lines passing through the geometrical center of the light-emission board and the straight line is a second included angle; and the second included angle is the largest one of the plurality of included angles between the first diagonal lines passing through the geometrical center of the light-emission board and the straight line.

For example, according to at least one embodiment of the disclosure, the light-emission board comprises a plurality of light-emission sub-boards; and at least one support portion is provided on each light-emission sub-board.

For example, according to at least one embodiment of the disclosure, at least two support portions having an identical and minimum distance to the geometrical center are located on different light-emission sub-boards, respectively, and the at least two support portions constitutes at least one vertex of the first polygon.

For example, according to at least one embodiment of the disclosure, at least one support portion provided on each light-emission sub-board constitutes a vertex of the second polygon.

For example, according to at least one embodiment of the disclosure, a plurality of reserved positions are provided at a side, facing the light diffusion structure, of each light-emission sub-board, and the support portion is provided at at least one reserved position on each light-emission sub-board.

For example, according to at least one embodiment of the disclosure, the reserved position comprises a through hole penetrating through the base substrate.

For example, according to at least one embodiment of the disclosure, a reflective film is provided between the base substrate and the light diffusion structure and comprises a plurality of first openings configured to expose at least part of the plurality of reserved positions.

For example, according to at least one embodiment of the disclosure, the reflective film further comprises a plurality of second openings configured to expose at least part of the plurality of light-emission units.

For example, according to at least one embodiment of the disclosure, the plurality of reserved positions on different light-emission sub-boards are the same in total number and relative positional relationship.

For example, according to at least one embodiment of the disclosure, the reflective film comprises two reflective sub-films, a gap is between the two reflective sub-films and is covered with a reflective strip.

For example, according to at least one embodiment of the disclosure, the reflective film comprises two reflective sub-films that partially overlap with each other.

For example, according to at least one embodiment of the disclosure, at least part of the plurality of light-emission units are arranged in an array in a first direction and a second direction that intersects the first direction; the plurality of light-emission sub-boards are arranged in an array in the first direction and the second direction, and at least part of structures on the plurality of light-emission sub-boards are of centrosymmetric distribution with respect to the geometrical center.

For example, according to at least one embodiment of the disclosure, the at least part of structures comprises the support portion and a driving circuit.

For example, according to at least one embodiment of the disclosure, at least two adjacent light-emission units constitute a light-emission-unit group, and the support portion is located between adjacent light-emission-unit groups.

For example, according to at least one embodiment of the disclosure, the encapsulation structure is doped with a color conversion material.

For example, according to at least one embodiment of the disclosure, the display device further comprises: a color conversion layer located between the light diffusion structure and the display panel.

BRIEF DESCRIPTION OF DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. Expressions such as "first", "second" and the like in the present disclosure do not denote any order, quantity, or importance, but rather are used for distinguishing different components. Expressions such as "include" or "comprise" and the like in the present disclosure denote that elements or objects appearing before the words of "include" or "comprise" cover the elements or the objects enumerated after the words of "include" or "comprise" or equivalents thereof, not exclusive of other elements or objects.

Figure 1:
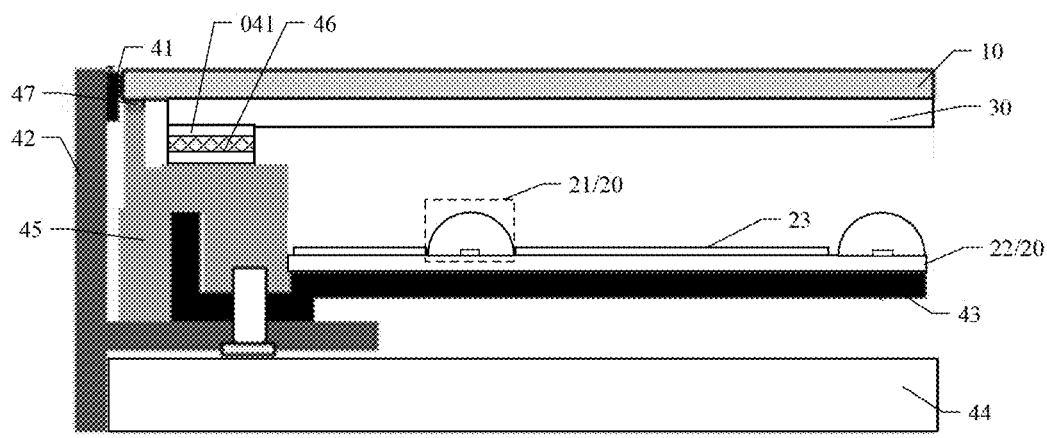
FIG. 1 is a cross-sectional schematic view illustrating a partial structure of a display device.

FIG. 1 is a cross-sectional schematic view illustrating a partial structure of a display device. As shown in FIG. 1, the display device includes a display panel 10, an optical film 30, a light-emission board 20, a back frame 43, an outer frame 42, a plastic frame 45 and a rear housing 44. A non-display side of the display panel 10 is provided on the plastic frame 45 by a transparent adhesive or a rubber pad 47, and a foam 41 is provided between a sidewall of the display panel 10 and the outer frame 42. The light-emission board 20 and the optical film 30 are provided on the non-display side of the display panel 10. The optical film 30 is located between the light-emission board 20 and the display panel 10 and configured to modulate a direction of light rays emitted by the light-emission board 20. The optical film 30 is provided on the plastic frame 45, and a light guide bar 46 is provided between the optical film 30 and the plastic frame 45. A transparent adhesive 041 is respectively provided on two sides of the light guide bar 46. The light-emission board 20 includes a base substrate 22 and a light-emission unit 21 provided on a side, facing the optical film 30, of the base substrate 22, and the light-emission board 20 is configured to provide backlight for the display panel 10. A reflective sheet 23 is provided on a side, facing the display panel 10, of the base substrate 22, and an opening is formed in the reflective sheet 23 to expose the light-emission unit 21. A distance between the optical film 30 and the base substrate 22 for example is 3 mm. The base substrate 22 for example includes structures such as a driving circuit, a wire and the like. The light-emission board 20 is provided on the back frame 43, and the back frame 43 is fixedly connected to the plastic frame 45 and the outer frame 42. The rear housing 44 is provided on a side, facing away from the light-emission board 20, of the back frame 43. The above-mentioned light-emission unit 21 for example is a bracket-type light-emission diode. The light-emission unit 21 has a maximum size approximately between 10 mm and 20 mm in a direction parallel to the base substrate 210 and a maximum size approximately between 3 mm and 7 mm in a direction perpendicular to the base substrate 210.

The light-emission board is required to at least guarantee that, at a preset viewing position, two adjacent light-emission units should be avoided from being presented as two independent light sources when the two adjacent light-emission units emit light lights having the same brightness, i.e., a hotspot phenomenon should be avoided. The inventors have found through experiments that: for the same light-emission board, the hotspot phenomenon substantially does not occur in the case that a diffusion plate having a thickness of 3 mm is directly provided on a light-emission side of the light-emission unit, and a slight hotspot phenomenon occurs in the case that a diffusion plate having a thickness of 2 mm is provided at a position having a distance of 1 mm from a surface of the light-emission unit of the light-emission board. Therefore, it needs to comprehensively take into account factors, such as a size of display area, a power consumption, a weight, a thickness, a fabrication cost, a yield of overall process and the like, of the display device, and design and select parameters such as a size of the light-emission unit, a distance between adjacent light-emission units, a distance between the light-emission board and the diffusion plate, a thickness of the diffusion plate and the like, so as to alleviate or eliminate the hotspot phenomenon.

Embodiments of the present disclosure provide a display device. The display device includes a display panel and a light-emission board. The light-emission board is located on a non-display side of the display panel and stacked with the display panel. The light-emission board includes a base substrate and a plurality of light-emission units provided on the base substrate. A maximum size of at least one light-emission unit in a direction parallel to the base substrate is not greater than 3 mm. Connecting lines of centers of four immediately adjacent light-emission units in the plurality of light-emission units define a quadrangle. Any two of the four immediately adjacent light-emission units are immediately adjacent to each other. A connecting line of centers of two light-emission units that define the quadrangle and have a largest distance therebetween passes through two first points in edges, close to each other, of the two light-emission units. A distance between the two first points is a first distance D1. An included angle between an outermost light ray of light rays emitted by one of the light-emission units and a plane parallel to the base substrate is $\theta$. A minimum distance between surfaces, close to each other, of the display panel and the base substrate is not less than $D1*\tan\theta/2$. The display device according to the embodiments of the present disclosure achieves good high dynamic range (HDR) effect while having a small thickness.

The display device according to the embodiments of the present disclosure will be described below with reference to the accompanying drawings.

Figure 2:
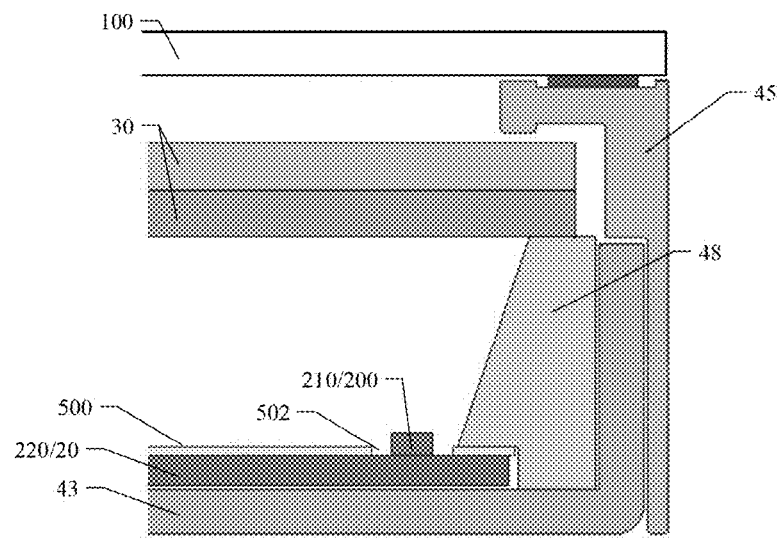
FIG. 2 is a cross-sectional schematic view illustrating a partial structure of a display device according to embodiments of the present disclosure.
Figure 3A:
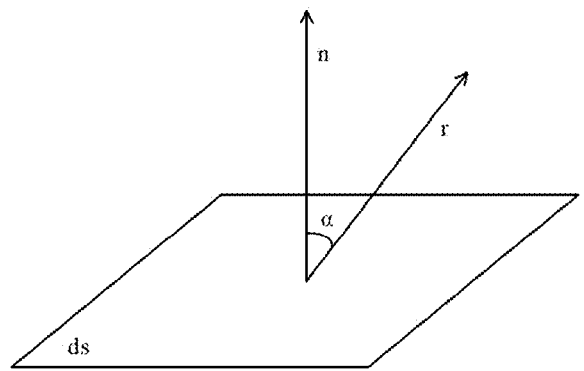
FIG. 3A is a schematic view illustrating equivalent light emission of a Lambert illuminant.
Figure 3B:
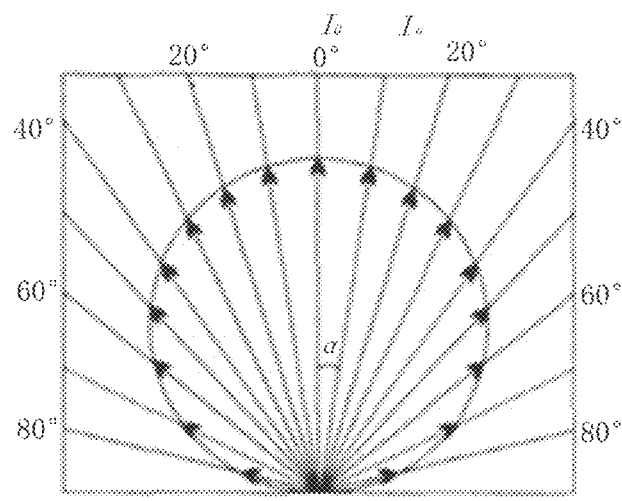
FIG. 3B is a schematic view illustrating light-emission angles and luminous intensity distribution of the Lambert illuminant.
Figure 4A:
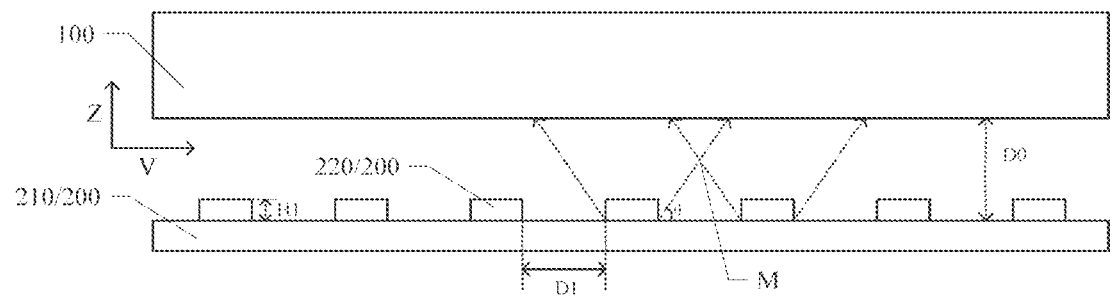
FIG. 4A is a partial schematic view illustrating the display device shown in FIG. 2.
Figure 5A:
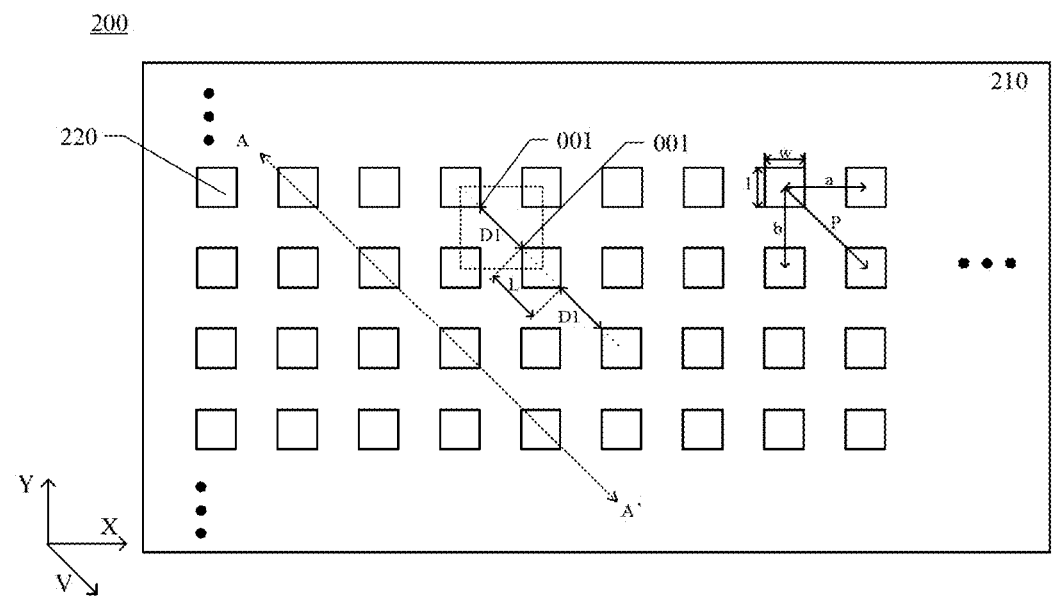
FIG. 5A is a planar schematic view illustrating a partial structure of a light-emission board in the display device shown in FIG. 4A.

FIG. 2 is a cross-sectional schematic view illustrating a partial structure of a display device according to embodiments of the present disclosure; FIG. 3A is a schematic view illustrating equivalent light emission of a Lambert illuminant; FIG. 3B is a schematic view illustrating light-emission angles and luminous intensity distribution of the Lambert illuminant; FIG. 4A is a partial schematic view illustrating the display device shown in FIG. 2; and FIG. 5A is a planar schematic view illustrating a partial structure of a light-emission board in the display device shown in FIG. 4A. The cross-sectional view shown in FIG. 4A is a cross-sectional view taken along line AA' shown in FIG. 5A.

As shown in FIG. 2, FIG. 4A and FIG. 5A, the display device includes a display panel 100 and a light-emission board 200 that are stacked. The light-emission board 200 is located on a non-display side of the display panel 100. For example, the light-emission board 200 serves as a backlight source and is configured to provide backlight to the display panel 100.

As shown in FIG. 2, FIG. 4A and FIG. 5A, the light-emission board 200 includes a base substrate 210 and a plurality of light-emission units 220 provided on the base substrate 210, and a maximum size of at least one light-emission unit 220 in a direction parallel to the base substrate 210 is not greater than 3 mm. For example, a contour shape of an orthographic projection of the light-emission unit 220 on the base substrate 210 is a rectangle, and the maximum size of the light-emission unit 220 in the direction parallel to the base substrate 210 is a length of a diagonal line of the light-emission unit 220. For example, the contour shape of the orthographic projection of the light-emission unit 220 on the base substrate 210 is a circle, and the maximum size of the light-emission unit 220 in the direction parallel to the base substrate 210 is a diameter of the light-emission unit 220. For example, the contour shape of the orthographic projection of the light-emission unit 220 on the base substrate 210 is an ellipse, and the maximum size of the light-emission unit 220 in the direction parallel to the base substrate 210 is a length of a long axis of the light-emission unit 220. For example, a size of an edge of a planar shape of the light-emission unit is not greater than 3 mm. For example, the light-emission unit 220 is located on a side, facing the display panel 100, of the base substrate 210. For example, the maximum size of each light-emission unit 220 in the direction parallel to the base substrate 210 is not greater than 3 mm. For example, the maximum size of the light-emission unit 220 in the direction parallel to the base substrate 210 is not greater than 500 µm. For example, the maximum size of the light-emission unit 220 in the direction parallel to the base substrate 210 is not greater than 300 µm. The light-emission unit in the light-emission board according to the embodiments of the present disclosure for example includes a mini light-emission diode (mini LED). The maximum size of the mini LED in the direction parallel to the base substrate 210 is not greater than 500 µm, e.g., not greater than 300 µm, or not greater than 250 µm, or not greater than 220 µm. A maximum size of each light-emission unit 220 in a direction perpendicular to the base substrate 210 is not greater than 2 mm, e.g., 1 mm, 0.75 mm, 0.6 mm, 0.15 mm, or 0.1 mm.

As shown in FIG. 2, FIG. 4A and FIG. 5A, connecting lines of centers of four immediately adjacent light-emission units 220 in the plurality of light-emission units 220 define a quadrangle. Any two of the four immediately adjacent light-emission units 220 are immediately adjacent to each other. A connecting line of centers of two light-emission units 220 that define the quadrangle and have a largest distance therebetween passes through two first points 001 in edges, close to each other, of the two light-emission units. A distance between the two first points 001 is a first distance D1. An included angle between an outermost light ray of light rays emitted by one of the light-emission units 220 and a plane parallel to the base substrate 210 is θ. A minimum distance between surfaces, close to each other, of the display panel 100 and the base substrate 210 is not less than D1*tan θ/2. The display device according to the embodiments of the present disclosure achieves good high dynamic range (HDR) effect while having a small thickness.

The "connecting lines of centers of four immediately adjacent light-emission units 220" described above for example refers to connecting lines of geometrical centers of the orthographic projections of the four immediately adjacent light-emission units 220 on the base substrate 210. The "first point" described above for example is a point in an edge of the orthographic projection of the light-emission unit 220 on the base substrate 210. The "four immediately adjacent light-emission units 220" described above for example refers to the four light-emission units 220 being adjacent to one another, with no other light-emission unit 220 being provided between any two of the four light-emission units 220. The "quadrangle" described above for example is a convex quadrangle.

For example, as shown in FIG. 4A and FIG. 5A, the above-mentioned quadrangle includes a parallelogram.

For example, as shown in FIG. 4A and FIG. 5A, at least part of the plurality of light-emission units 220 are arranged in an array in a first direction and a second direction, and the first direction intersects the second direction. For example, the first direction is an X-direction, while the second direction is a Y-direction. However, the embodiments of the disclosure are not limited thereto, the first direction and the second direction for example are interchangeable. For example, the first direction and the second direction are perpendicular or not perpendicular to each other. For example, the light-emission board 200 includes a plurality of regions. The light-emission units 220 in at least one region are arranged in an array in the first direction and the second direction. For example, the first direction is a row direction, while the second direction is a column direction. Alternatively, the first direction is the column direction, while the second direction is the row direction.

For example, the plurality of light-emission units 220 provided in the first direction are arranged at equal intervals, and the plurality of light-emission units 220 provided in the second direction are arranged at equal intervals. For example, the light-emission units 220 arranged in the first direction are arranged strictly in the first direction, i.e., a connecting line of the geometrical centers of any adjacent light-emission units 220 is parallel to the first direction. For example, the light-emission units 220 arranged in the second direction are arranged strictly in the second direction, i.e., a connecting line of the geometrical centers of any adjacent light-emission units 220 is parallel to the second direction.

For example, connecting lines of centers of two adjacent light-emission units 220 arranged in the first direction and two light-emission units 220 respectively adjacent to, the two adjacent light-emission units 220 arranged in the first direction, in the second direction define the quadrangle, and an included angle between an edge of the quadrangle and the first direction or the second direction has a value in a range of −20° to 20°. For example, the included angle between any edge of the quadrangle and the first direction or the second direction is not more than 15°, for example, is 14°, 13°, 10°, 5°, 0°, etc. For example, the edge of the quadrangle is parallel to the first direction or the second direction.

Figure 5B:
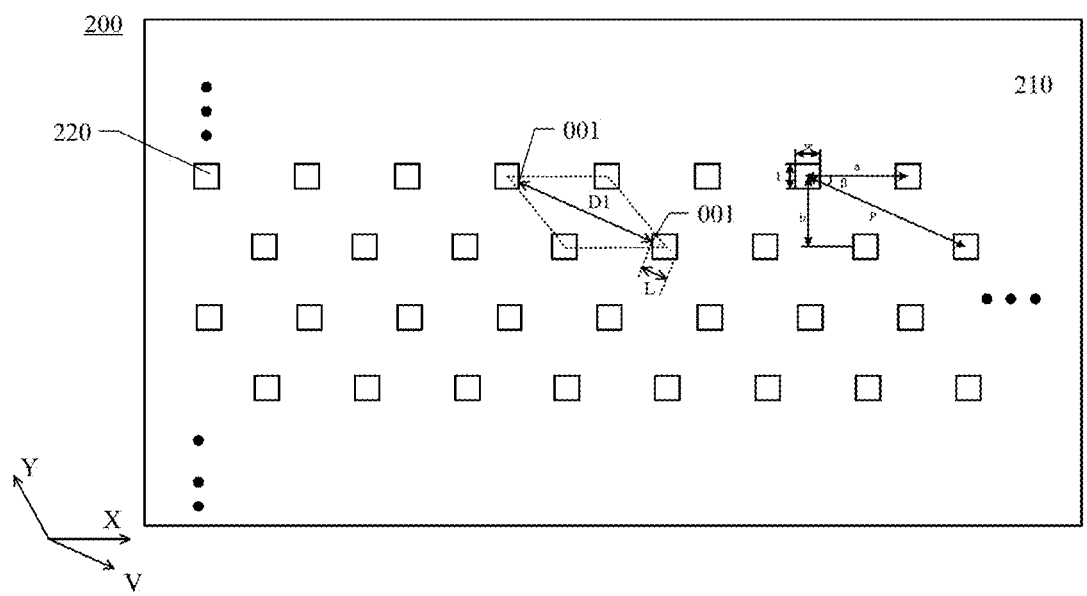
FIG. 5B is a planar schematic view illustrating a partial structure of the light-emission board according to another example of the embodiments of the present disclosure.
Figure 5C:
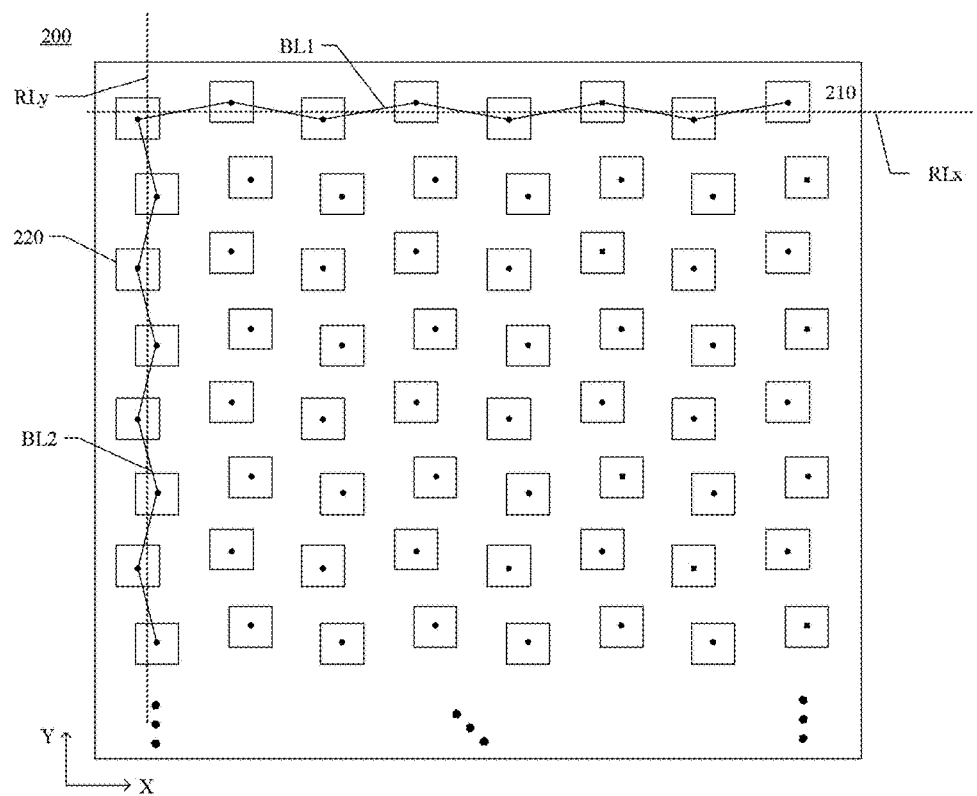
FIG. 5C is a planar schematic view illustrating a partial structure of the light-emission board according to another example of the embodiments of the present disclosure.

FIG. 5C is a planar schematic view illustrating a partial structure of the light-emission board according to another example of the embodiments of the present disclosure. For example, as shown in FIG. 5C, the light-emission units 220 arranged in the first direction (e.g., the X-direction shown in the figure) are arranged roughly in the first direction. That is, the light-emission units 220 are provided roughly in the first direction, and connecting lines of the geometrical centers of adjacent light-emission units 220 define a zigzag first broken line BL1 rather than a straight line parallel to the first direction. An included angle between any line segment of the first broken line BL1 and the first direction is not more than 20°, e.g., 10°-18°. For example, the included angle between any portion of the first broken line BL1 and the first direction is not more than 15°. e.g., 12°-14°, such as 12.5° or 13°. For example, in the plurality of light-emission units 220 provided roughly in the first direction, the geometrical centers of two adjacent light-emission units 220 are respectively located on two different sides of a reference line RLx, and shortest straight-line distances of the plurality of light-emission units 220 provided roughly in the first direction respectively with respect to the reference line RLx are approximately same, where the reference line RLx is parallel to the first direction.

For example, as shown in FIG. 5C, the light-emission units 220 arranged in the second direction (e.g., the Y-direction shown in the figure) are arranged roughly in the second direction. That is, the light-emission units 220 are provided roughly in the second direction, and connecting lines of the geometrical centers of adjacent light-emission units 220 define a zigzag second broken line BL2 rather than a straight line parallel to the second direction. An included angle between any line segment of the second broken line BL2 and the second direction is not more than 20°, e.g., 10°-18°. For example, the included angle between any portion of the second broken line BL2 and the second direction is not more than 15°, e.g., 12°-14°, such as 12.5° or 13°. For example, in the plurality of light-emission units 220 provided roughly in the second direction, the geometrical centers of two adjacent light-emission units 220 are respectively located on two different sides of a reference line RLy, and shortest straight-line distances of the plurality of light-emission units 220 provided roughly in the second direction respectively respect to the reference line RLy are approximately same, where the reference line RLy is parallel to the second direction.

For example, as shown in FIG. 4A and FIG. 5A, the connecting lines of centers of two adjacent light-emission units 220 arranged in the first direction and two light-emission units 220 respectively adjacent to, the two adjacent light-emission units 220 arranged in the first direction, in the second direction define the quadrangle, and an edge of the quadrangle is parallel to the first direction or the second direction.

For example, in the quadrangle, two edges are parallel to the first direction, and the other two edges are parallel to the second direction. For example, the connecting line of centers of two adjacent light-emission units 220 arranged in the first direction is an edge of the quadrangle. For example, the connecting line of centers of two adjacent light-emission units 220 arranged in the second direction is another edge of the quadrangle. For example, the above-mentioned quadrangle is a rectangle or a parallelogram. The center of the above-mentioned light-emission unit for example is the geometrical center of the light-emission unit. The above-mentioned two adjacent light-emission units 220 arranged in the first direction for example refer to no other light-emission unit 220 being provided between the two adjacent light-emission units 220 arranged in the first direction. The above-mentioned two adjacent light-emission units 220 arranged in the second direction for example refer to no other light-emission unit 220 being provided between the two adjacent light-emission units 220 arranged in the second direction.

As shown in FIG. 4A and FIG. 5A, the distance between two first points 001 in edges, close to each other, of two light-emission units 220 that define the quadrangle and have the largest distance therebetween is the first distance D1. For example, the distance between two first points 001 in edges, opposite to each other, of two light-emission units 220 that define the quadrangle and have the largest distance therebetween is the first distance D1. For example, the two light-emission units 220 that define the quadrangle and have the largest distance therebetween are two light-emission units 220 located at two endpoints of a diagonal line of the quadrangle. For example, the first distance D1 between the two light-emission units 220 that define the quadrangle and have the largest distance therebetween is smaller than a length of the diagonal line of the quadrangle. For example, the two light-emission units 220 that define the quadrangle and have the largest distance therebetween are arranged in a V-direction that intersects both of the X-direction and the Y-direction. For example, the connecting line of the geometrical centers of the two light-emission units 220 that define the quadrangle and have the largest distance therebetween extends in the V-direction, and the connecting line between edges, opposite to each other, of the two light-emission units 220 that define the quadrangle and have the largest distance therebetween also extends in the V-direction or has an included angle within +5° with respect to the V-direction.

For example, in the case that the above-mentioned quadrangle is a rectangle, a size of the light-emission unit 220 in the first direction is w, while a size of the light-emission unit 220 in the second direction is 1; and a distance between the centers of two adjacent light-emission units 220 arranged in the first direction is a, while a distance between the centers of two adjacent light-emission units 220 arranged in the second direction is b, where a and b meet a<b. The above-mentioned w and 1 meet w<1, and the length P of the diagonal line of the quadrangle is $(a^2+b^2)^{1/2}$.

For example, a line of the light-emission unit 220 truncated by an extension line of the connecting line of the two first points 001 has a size of L. The "line of the light-emission unit 220 truncated by the extension line of the connecting line of the two first points 001" described above for example refer to a connecting line of two points at which the extension line of the connecting line of the two first points 001 intersects the orthographic projection of the light-emission unit 220 on the base substrate 210. The above-mentioned L meets: L=w/cos[arctan(b/a)]. The first distance D1 meets: D1=P−L.

It should be understood that in the case that the contour shape of the above-mentioned orthographic projection of the light-emission unit 220 on the base substrate 210 is a circle, the line of the light-emission unit 220 truncated by the extension line of the connecting line of the two first points 001 has the size of L, and L is equal to the diameter of the circle.

For example, as shown in FIG. 4A and FIG. 5A, an included angle between an outermost light ray of light rays emitted by the light-emission unit 220 and a plane parallel to the base substrate 210 is θ. A minimum distance D0 between surfaces, close to each other, of the display panel 100 and the base substrate 210 is not less than (D1*tan θ)/2. FIG. 4A schematically illustrates that the outermost light ray of the light rays emitted by the light-emission unit 220 is emitted from a contact position of the light-emission unit 220 and the base substrate 210. In an actual product, the outermost light ray of the light rays emitted by the light-emission unit 220 for example is emitted from a position, having a smaller distance with respect to the base substrate 210, of the light-emission unit 220.

As shown in FIG. 3A and FIG. 3B, if the luminous intensity of an extended light source is dI∝ cosα, that is, the brightness thereof has no relationship with direction, then such light source is called as a cosinoidal illuminant or Lambert (J.H. Lambert) illuminant. The above-mentioned law of emitting luminous flux according to cos α law is called as Lambert's cosine law. In the above formula, dI represents the luminous intensity of each surface element dS of an extended optical surface in a certain direction r, and α is an included angle between the light emission direction r of the light source and a normal line n. Luminous intensity distribution meets: Iα=$I_O$cosα, $I_O$ representing the luminous intensity distribution in a normal direction perpendicular to the light source surface; m=(−ln2)/(lncos $α_{1/2}$). That is, m is decided by $α_{1/2}$, where $α_{1/2}$ is defined as an included angle between the light emission direction and the normal line n when the luminous intensity drops to half of the luminous intensity corresponding to the normal direction, and a value of $α_{1/2}$ ranges from 40° to 80°. In other words, if the luminous intensity of light rays emitted in the normal direction n is defined as 1, then the luminous intensity of light rays having an included angle $α_{1/2}$ with respect to the normal line n is ½, and the luminous intensity of light rays emitted in a direction having an included angle of greater than $α_{1/2}$ with respect to the normal line n is relatively low. That is, while the Lambert illuminant emits countless light rays in theory, the light rays having different included angles with respect to the normal line n are different in luminous intensity.

Figure 4B:
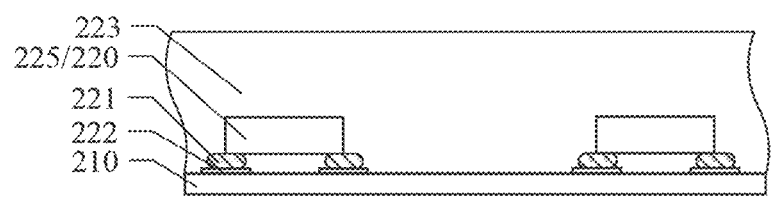
FIG. 4B and FIG. 4C are schematic views illustrating light-emission units in different examples.
Figure 4C:
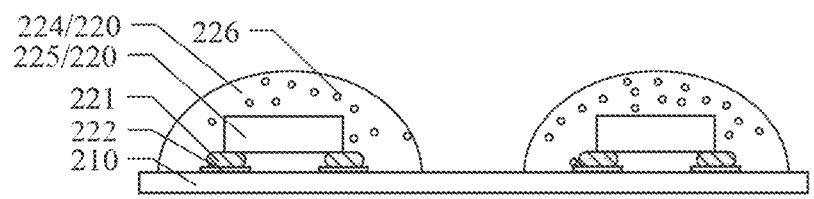

FIG. 4B and FIG. 4C are schematic views of light-emission units in different examples. For example, as shown in FIG. 4B, the light-emission unit 220 includes an unencapsulated light-emission diode chip 225, and the unencapsulated light-emission diode chip 225 has a maximum size of not greater than 500 μm in the direction parallel to the base substrate 210.

For example, the light-emission unit 220 is the unencapsulated light-emission diode chip 225, and the unencapsulated light-emission diode chip 225 is a sub-millimeter inorganic light-emission diode (i.e. mini LED). For example, the thickness of the unencapsulated light-emission diode chip 225 is 70 μm to 180 μm, and the maximum size of the unencapsulated light-emission diode chip 225 in the direction parallel to the base substrate 210 is not greater than 500 μm.

For example, the unencapsulated light-emission diode chip 225 is equivalent to the Lambert illuminant. The light ray emitted by the unencapsulated light-emission diode chip 225 and having the included angle of greater than $α_{1/2}$ with respect to the normal line n is low in luminous light, so that it is not within the discussion scope of the present disclosure; in this case, in the embodiments of the present disclosure, the light ray emitted by the unencapsulated light-emission diode chip 225 and having the included angle $\alpha_{1/2}$ with respect to the normal line n is defined as the outermost light ray of the unencapsulated light-emission diode chip 225, i.e., the outermost light ray of the light-emission unit 220.

For example, as shown in FIG. 4A and FIG. 4B, a protective layer 223 is provided on a side, facing the display panel 100, of the plurality of light-emission units 220. For example, in order to prevent the unencapsulated light-emission diode chip 225 from being scratched and collided during subsequent manufacture procedure, e.g., in the process of placing an optical film on the light-emission board 200 or in the process of transportation, the protective layer 223 for example is configured to protect the plurality of unencapsulated light-emission diode chips 225 of the light-emission board 200. For example, the plurality of unencapsulated light-emission diode chips 225 share the same protective layer 223. For example, the protective layer 223 is made of a transparent material, e.g., transparent silicone. For example, the surface, facing away from the base substrate 210, of the protective layer 223 is an almost flat surface, thereby increasing the performance of the display device.

For example, in order to reduce the total reflection of the light emitted by the light-emission diode chip 225 within the protective layer 223, the protective layer 223 has a refractive index between the refractive index of the light-emission diode chip 225 and the refractive index of a material (e.g., air) adjacent to the protective layer 223. For example, the refractive index of the protective layer 223 is between 1.2 and 1.6. For example, the refractive index of the protective layer 223 is between 1.3 and 1.4. For example, the refractive index of the protective layer 223 is less than 1.4. For example, the refractive index of the protective layer 223 is less than 1.5. For example, the refractive index of the protective layer 223 is greater than 1.1. For example, the refractive index of the protective layer 223 is greater than 1.2. For example, the refractive index of the protective layer 223 is greater than 1.3. For example, the refractive index of the protective layer 223 is about 1.35. For example, the protective layer 223 covers all unencapsulated light-emission diode chips 225 of the light-emission board 200. The protective layer 223 for example has an upper surface which is flat or is slightly concave-convex. For example, the thickness of the protective layer 223 is slightly greater than that of the unencapsulated light-emission diode chip 225.

For example, as shown in FIG. 4C, the light-emission unit 220 includes a light-emission diode chip 225 and an encapsulation structure 224 configured to encapsulate the light-emission diode chip 225, and a gap exists between the encapsulation structures 224 of adjacent light-emission units 220.

For example, as shown in FIG. 4C, the light-emission unit 220 includes the unencapsulated light-emission diode chip 225, and the unencapsulated light-emission diode chip 225 is the sub-millimeter light-emission diode (i.e. mini LED). For example, the size of the unencapsulated light-emission diode chip 225 in the direction perpendicular to the base substrate 210 is 70 μm to 180 μm, and the maximum size of the unencapsulated light-emission diode chip 225 in the direction parallel to the base substrate 210 is not greater than 500 μm. It should be understood that the light-emission diode chip after being encapsulated is the light-emission unit 220. The maximum size in the direction parallel to the base substrate 210 and the thickness of the encapsulated light-emission diode chip are both increased as compared with the corresponding parameters of the unencapsulated light-emission diode chip 225. For example, the maximum size of the light-emission unit 220 in the direction parallel to the base substrate 210 is not greater than 3 mm, for example, is 1.5 mm, 1 mm, 0.5 mm, etc. The maximum size of each light-emission unit 220 in the direction perpendicular to the base substrate 210 is not greater than 2 mm, for example, is 1 mm, 0.75 mm, 0.6 mm, 0.15 mm, or 0.1 mm.

For example, as shown in FIG. 4C, a single light-emission diode chip 225 is encapsulated into an independent element serving as the light-emission unit 220, then the light-emission unit 220 is placed at a corresponding position on the light-emission board 200 and fixedly connected to the light-emission board 200. The unencapsulated light-emission diode chip is considered as the Lambert illuminant, and thus after the light-emission diode chip is encapsulated, the light rays having a light-emission angle in a range of +$\alpha_{1/2}$ to -$\alpha_{1/2}$ is emitted, and the light rays having the light-emission angle beyond +$\alpha_{1/2}$ to -$\alpha_{1/2}$ is substantially restrained within the independent element without being emitted due to total reflection. In this case, the included angle θ between the outermost light ray of the light rays emitted by the light-emission unit and the base substrate is the complementary angle of $\alpha_{1/2}$.

For example, as shown in FIG. 4B, the light-emission diode chip 225 is firstly placed at the corresponding position of the light-emission board 200 and then is encapsulated. In some examples, each light-emission diode chip is encapsulated with a transparent material, e.g., transparent silicone, by silk-screen printing or dot printing to form the encapsulation structure 224. The light-emission angle of the light-emission diode chip for example is modulated based on different shapes of the encapsulation structure 224, whereby causing the light-emission angle of the light-emission unit to change. For example, the surface, facing away from the base substrate, of the encapsulation structure is a curved surface, the light-emission angle of the outermost light ray in the light rays emitted by the light-emission unit is slightly greater than $\alpha_{1/2}$ of the light-emission diode chip. If the value of $\alpha_{1/2}$ ranges from 40° to 65°, then the light-emission angle of the outermost light ray in the light rays emitted by the light-emission unit ranges from 50° to 70°.

For example, the encapsulation structure 224 has any desired size in the direction perpendicular to the base substrate 210, such as less than 0.5 mm, between 0.1 mm and 0.4 mm, between 0.2 mm and 0.4 mm, less than 0.3 mm, between 0.25 mm and 0.35 mm, between 0.15 mm and 0.25 mm, about 0.2 mm, and about 0.3 mm. For example, the maximum size of the encapsulation structure 224 in the direction parallel to the base substrate 210 is between 0.3 mm and 2.5 mm, between 0.3 mm and 0.7 mm, between 0.8 mm and 0.9 mm, greater than 0.5 mm, greater than 1.0 mm, greater than 2.0 mm, less than 2.0 mm, or the like. A ratio of the maximum size of the encapsulation structure 224 in the direction parallel to the base substrate 210 to the size of the encapsulation structure 224 in the direction perpendicular to the base substrate 210 is greater than 3, or between 4 and 6, less than 10, etc.

For example, after the light-emission diode chip is encapsulated into the independent element, the geometrical center of the orthographic projection of the light-emission diode chip on the base substrate coincides with the geometrical center of the orthographic projection of the independent element on the base substrate, but the embodiments are not limited thereto. The geometrical center of the orthographic projection of the light-emission diode chip on the base substrate for example has a deviation with respect to the geometrical center of the orthographic projection of the independent element on the base substrate. The thickness H1 of the light-emission unit 220 in the direction perpendicular to the base substrate 210 is the thickness of the encapsulated light-emission diode chip.

For example, as shown in FIG. 4B and FIG. 4C, the light-emission unit 220 or the light-emission diode chip 225 is connected to a pad 222 on the base substrate 210 by means of a weld metal 221. For example, the weld metal 221 includes soldering tin.

For example, as shown in FIG. 4C, the encapsulation structure 224 is doped with a color conversion material 226. For example, the color conversion material 226 includes a fluorescent powder material or a quantum dot material. For example, the color conversion material 226 converts blue light into white light. For example, the color conversion material 226 converts blue light into red light and green light.

For example, the display panel 100 is a liquid crystal display panel. For example, the liquid crystal display panel includes an array substrate (not shown), an opposed substrate (not shown), and a liquid crystal layer (not shown) located between the array substrate and the opposed substrate.

For example, a side, facing the opposed substrate, of the array substrate includes a plurality of gate lines extending in one direction and a plurality of data lines extending in another direction. The plurality of gate lines and the plurality of data lines intersect to define a plurality of pixel units arranged in an array, and the plurality of pixel units are arranged into a pixel array. Each pixel unit for example includes a pixel electrode and a thin film transistor. The gate line is connected to a gate of the thin film transistor to control the thin film transistor to be switched on or off. The pixel electrode is connected to one of a source electrode and a drain electrode of the thin film transistor, and the data line is connected to the other one of the source electrode and the drain electrode of the thin film transistor. The data line inputs a voltage signal required for displaying an image to the pixel electrode through the thin film transistor so that display is realized.

For example, the opposed substrate is a color filter substrate. A color filter layer corresponding to the pixel units and a black matrix covering structures such as the gate lines and the data lines located in a non-display region for example are provided on a side, facing the array substrate, of the color filter substrate. For example, a common electrode opposite to the pixel electrode is further be provided on the side, facing the array substrate, of the color filter substrate. The common electrode is configured to apply a common voltage and cooperate with the pixel electrode to generate an electric field for driving liquid crystal molecules in the liquid crystal layer to deflect. The liquid crystal molecules deflect to change the transmittance of the liquid crystal layer, thereby realizing the display of a desired grayscale image.

For example, the display panel 100 further includes a first polarizer provided on a side, facing away from the opposed substrate, of the array substrate, and a second polarizer provided on a side, facing away from the array substrate, of the opposed substrate. The first polarizer includes a light transmitting axis extending in a direction DI1 and causes light from the backlight source and incident thereon to polarize in the direction DI1. The second polarizer includes a light transmitting axis extending in a direction DI2 and causes light incident thereon to polarize in the direction DI2. For example, the light transmitting axis of the first polarizer and the light transmitting axis of the second polarizer are perpendicular to each other.

It should be understood that, as shown in FIG. 4A and FIG. 5A, four light-emission units 220 defining the above-mentioned quadrangle are electrically connected, e.g., electrically connected in series with each other, or electrically connected in parallel to one another, or electrically connected in series in pairs and then connected in parallel. However, the embodiments of the disclosure are not limited thereto, part of the four light-emission units 220 defining the above-mentioned quadrangle have no electrical connection relationship, which will not be limited in the embodiments of the present disclosure.

For example, the display device further includes a color conversion layer located between a light diffusion structure 300 and the display panel 100. For example, the display device is provided with one of the color conversion layer and the color conversion material. For example, the light-emission unit 220 having the emitted light of single color combines with the color conversion layer 034 (shown in FIG. 16), so that white light emission in combination with a passive display panel can realize a full-color picture display. For example, the light-emission unit 220 emits blue light, the color conversion layer includes a phosphor layer (e.g., yellow phosphor material or other photoluminescent material layers) that is capable of converting incident blue light into light of other colors. The light-emission unit 220 emits light having any suitable color. For example, the light-emission unit 220 emits light of a single color, such as blue light, red light or green light.

For example, the base substrate 210 is a printed circuit board (PCB), or glass substrate, plastic substrate, polyimide substrate, polymethyl methacrylate substrate or the like on which a wire is provided. For example, a control circuit controls the light-emission unit 220 by means of the wire provided on the light-emission board 200, thereby achieving a partial light dimming solution helpful to improve the dynamic range of an image displayed by the pixel array.

For example, each light-emission unit 220 includes a p electrode, a p-type semiconductor layer, an n electrode, an n-type semiconductor layer and a light-emission layer. Holes and electrons are injected into the n-type semiconductor layer and the p-type semiconductor layer from the n electrode and the p electrode, respectively, and recombined in the light-emission layer to release photons, with a light emission wavelength depending on a forbidden bandwidth of the light-emission material forming the light-emission layer.

FIG. 5B is a schematic view illustrating a partial planar structure of the light-emission board according to another example of the embodiments of the present disclosure. The light-emission board shown in FIG. 5B and the light-emission board shown in FIG. 5A differs in the arrangement of the light-emission units 220. The first direction and the second direction in the arrangement of the light-emission units 220 shown in FIG. 5A are perpendicular to each other, and an included angle between the first direction and the second direction in arrangement of the light-emission units 220 shown in FIG. 5B is an obtuse angle.

For example, FIG. 5A and FIG. 5B schematically illustrate that a plurality of light-emission units 220 are arranged at equal intervals in any direction. However, the embodiments of the disclosure are not limited thereto, the light-emission units 220 in at least a partial region for example are arranged at unequal intervals in a certain direction.

For example, as shown in FIG. 5B, the above-mentioned quadrangle is not a rectangle; the size of the light-emission unit 220 in the first direction is w, while the size of the light-emission unit 220 in the second direction is 1; and a distance between the centers of two adjacent light-emission units 220 arranged in the first direction is a, while the distance between the centers of two adjacent light-emission units 220 arranged in a third direction perpendicular to the first direction is b in the third direction, where a and b meet a<b. The above-mentioned w and 1 meet w<1, and the length P of the diagonal line of the quadrangle is $(a^2+b^2+2*a*b*\cos \beta)^{1/2}$.

For example, a line of the light-emission unit 220 truncated by an extension line of the connecting line of the two first points 001 has a size of L. The "line of the light-emission unit 220 truncated by the extension line of the connecting line of the two first points 001" described above for example refers to a connecting line of two points at which the extension line of the connecting line of the two first points 001 intersects the orthographic projection of the light-emission unit 220 on the base substrate 210. The above-mentioned L meets: $L=w/\cos \beta$. The first distance D1 meets: $D1=P-L$.

It should be understood that if the contour shape of the above-mentioned orthographic projection of the light-emission unit 220 on the base substrate 210 is a circle, the line of the light-emission unit 220 truncated by the extension line of the connecting line of the two first points 001 has the size of L, which is equal to the diameter of the circle.

For example, as shown in FIG. 4A and FIG. 5A, in the light rays emitted by two adjacent light-emission units 220 arranged in the V-direction, the outermost light rays intersect to provide a light mixing point M of the two adjacent light-emission units 220 arranged in the V-direction.

For example, the minimum distance D0 between surfaces, close to each other, of the display panel 100 and the base substrate 210 is not less than a distance between the light mixing point M of two adjacent light-emission units 220 and a surface, facing the display panel 100, of the base substrate 220, which is $(D1*\tan \theta)/2$, where $\theta=90°-\alpha\frac{1}{2}$.

By setting the distance between the display panel and the base substrate to be greater than the distance between the light mixing point M and the base substrate, the light rays emitted by adjacent light-emission units are mixed before being incident on the display panel to prevent the hotspot problem. For example, as shown in FIG. 4A and FIG. 5A, the position of the above-mentioned light mixing point M is related to the size of the light-emission unit 220, the first distance D1 between adjacent light-emission units and the included angle θ between the outermost light ray in the light rays emitted by the light-emission unit 220 and the base substrate. For example, in addition to the light rays emitted by two adjacent light-emission units 220 intersecting to form the light mixing point as described above, the light rays emitted by two non-adjacent light-emission units 220 (e.g., one or more light-emission units 220 are further provided between the two non-adjacent light-emission units 220) arranged in the V-direction are also intersect to form a light mixing point.

For example, as shown in FIG. 2, the display device includes an optical film 30, a back frame 43, a plastic frame 45, a support frame 48 and a rear housing 44. The plastic frame 45 is configured to support the display panel 100. The light-emission board 20 and the optical film 30 are provided on the non-display side of the display panel 100. A support portion, which is configured to support the display panel 100, of the plastic frame 45 is located between the optical film 30 and the display panel 100. The optical film 30 is located between the light-emission board 200 and the display panel 100 and configured to at least modulate a direction of light rays emitted by the light-emission board 20. The optical film 30 for example includes a plurality of layers, e.g., layers such as a light diffusion structure, a color conversion layer and a prism layer. For example, the thickness of the light diffusion structure is 1.5 mm. The support frame 48 is provided between the optical film 30 and the light-emission board 20 and configured to support the optical film 30. For example, FIG. 2 schematically illustrates that a distance exists between the light diffusion structure and the light-emission board 20, and the distance for example is 7 mm. The light-emission board 200 includes the base substrate 210 and the light-emission unit 220 provided on the side, facing the optical film 30, of the base substrate 210, and is configured to provide backlight to the display panel 100. The base substrate 210 for example includes structures such as a driving circuit and a reflective film. The thickness of the base substrate 210 for example is 1.27 mm. The light-emission board 200 and the support frame 48 are provided on the back frame 43.

Figure 6:
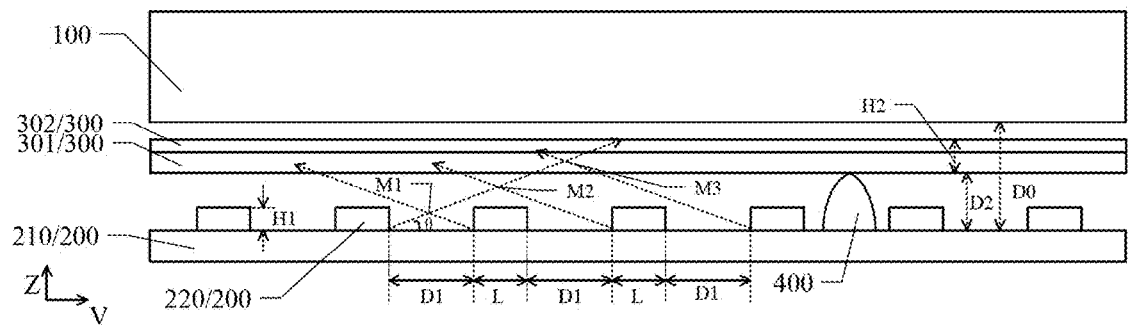
FIG. 6 is a cross-sectional schematic view illustrating a partial structure of the display device according to an example of the embodiments of the present disclosure.

FIG. 6 is a schematic view illustrating a partial cross-sectional structure of the display device according to an example of the embodiments of the present disclosure. For example, as shown in FIG. 6, the display device further includes the light diffusion structure 300 located between the light-emission board 200 and the display panel 100.

For example, the light diffusion structure 300 includes only one diffusion layer, or includes two or more diffusion layers that for example are bonded to each other using an adhesive (e.g., a pressure-sensitive adhesive). For example, the adhesive has a diffusion property to improve the diffusion effect of the light diffusion structure. For example, the two or more diffusion layers described above are pressed together to form an overall structure. However, the embodiments of the present disclosure are not limited thereto, and the multiple layers included in the light diffusion structure for example are not bonded to each other. For example, other optical film (e.g., a prism) is sandwiched between two layers of the light diffusion structure.

For example, as shown in FIG. 6, the display device is a large-size display device. For example, in the large-size display device, the value of the above-mentioned θ ranges from 20° to 30°, and the above-mentioned first distance D1 and the above-mentioned L meet: $D1/L=3-10$. For example, the diagonal line of the display surface of the large-size display device has a length of greater than 30 inches, specifically, such as 32 inches and 34 inches. The large-size display device includes products such as a monitor, a desktop computer and a television. The above-mentioned distance between adjacent light-emission units 220 for example refers to the distance between edges, close to each other, of the adjacent light-emission units 220. The above-mentioned "size of the light-emission unit 220" for example refers to the maximum size of the light-emission unit 220 in the direction parallel to the base substrate. For example, the above-mentioned θ is 20°, or 25°, or 30°. For example, the value of D1/L is 5 to 8. For example, the value of D1/L is 4 to 7.

For example, the length and the width of the display surface of the large-size display device are DL and DW, respectively, and an optimal viewing distance for a user to view the large-size display device is between 3DW and 5DW. It should be understood that the larger the size of the display device is, the greater the optimal viewing distance is, and meanwhile, the requirement for the overall thickness is relatively low. Moreover, considering the cost of the display device, the total number of the light-emission units 220 included in the light-emission board in the display device does not increase proportionally with the increase of the size of the display device. Therefore, the arrangement density of the light-emission units 220 on the light-emission board in the large-size display device is relatively small. That is, the distance between adjacent light-emission units 220, e.g., the first distance D1, is relatively large.

For example, as shown in FIG. 6, the light mixing point of the light rays emitted by two adjacent light-emission units 220 is a first light mixing point M1, and the distance between the first light mixing point M1 and the base substrate 210 is (D1*tan θ)/2. The above-mentioned distance for example is called as a first-stage light mixing distance, and a first-stage light mixing occurs at the position of the first light mixing point M1.

For example, as shown in FIG. 6, the line of the light-emission unit 220 truncated by the extension line of the connecting line of two first points has the size of L. In the V-direction, the light mixing point of the light rays emitted by the Nth light-emission unit 220 and the (N+2)th light-emission unit 220 is a second light mixing point M2; the distance between the second light mixing point M2 and the base substrate 210 is [(2*D1+L)*tan θ]/2; the above-mentioned distance is called as a second-stage light mixing distance, and a second-stage light mixing occurs at the position of the second light mixing point M2. In the V-direction, the light mixing point of the light rays emitted by the Nth light-emission unit 220 and the (N+3)th light-emission unit 220 is a third light mixing point M3; the distance between the third light mixing point M3 and the base substrate 210 is [(3*D1+2L)*tan θ]/2; the above-mentioned distance is called as a third-stage light mixing distance, and a third-stage light mixing occurs at the position of the third light mixing point M3. The above-mentioned N is a positive integer greater than zero. It will be understood that the luminous intensity of a light ray propagating in any direction is inversely proportional to the square of a distance. The third light mixing point M3 has a larger distance to the base substrate 210 than the second light mixing point M2, while the second light mixing point M2 has a larger distance to the base substrate 210 than the first light mixing point M1, and therefore, the light mixing effect at the first light mixing point M1 is better.

For example, as shown in FIG. 6, the thickness of the light diffusion structure 300 in the direction perpendicular to the base substrate 210 (e.g., the Z-direction in the figure) is less than (D1*tan θ)/2. The light diffusion structure 300 is spaced apart from the light-emission board 200. A distance between a surface on a side, facing the light-emission board 200, of the light diffusion structure 300 and a surface, facing the base substrate 210, of the light-emission unit 220 is a second distance D2, and the second distance D2 meets: (D1*tan θ)/2<D2<[(3*D1+2L)*tan θ]/2.

For example, in the case that the thickness of the light diffusion structure 300 is less than (D1*tan θ)/2, the thickness of the light diffusion structure 300 is smaller than the above-mentioned first-stage light mixing distance. If there is no a gap between the light diffusion structure 300 and the light-emission board 200 and the above-mentioned first-stage light mixing does not occur before the light diffusion structure 300, hotspot is prone to occurring. For example, the thickness H2 of the light diffusion structure 300 is 3 mm, and (D1*tan θ)/2 is greater than 3 mm. By setting the value of the second distance between the light diffusion structure 300 and the light-emission board 200, the first-stage light mixing of the light rays emitted by adjacent light-emission units 220 is realized before the light rays are incident on the light diffusion structure 300, but the third-stage light mixing does not occur. Thus, while achieving good light homogenization effect, the display device is avoided from having a large thickness.

Figure 7:
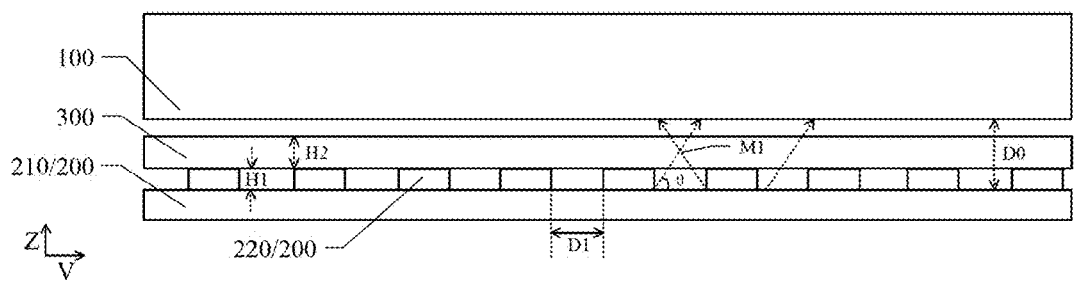
FIG. 7 is a cross-sectional schematic view illustrating a partial structure of the display device according to an example of the embodiments of the present disclosure.

FIG. 7 is a schematic view illustrating a partial cross-sectional structure of the display device according to an example of the embodiments of the present disclosure. For example, as shown in FIG. 7, the display device further includes the light diffusion structure 300 located between the light-emission board 200 and the display panel 100. The light diffusion structure 300 in the display device shown in FIG. 7 for example has the same features with the light diffusion structure 300 shown in FIG. 6, which will not be described here redundantly.

For example, as shown in FIG. 7, the display device is a small-size display device. For example, in the small-size display device, the value of the above-mentioned θ ranges from 10° to 25°, and the above-mentioned first distance D1 and the above-mentioned L meet: D1/L=5-11. For example, the diagonal line of the display surface of the small-size display device has a length between 7 inches and 27 inches, specifically, such as 7.9 inches, 8 inches, 9 inches, 9.7 inches, 10.9 inches, 12.9 inches and 27 inches. The small-size display device includes products such as a palm computer, a tablet computer and a laptop. The above-mentioned distance between adjacent light-emission units 220 for example refers to the distance between edges, close to each other, of the adjacent light-emission units 220. The above-mentioned "size of the light-emission unit 220" for example refers to the maximum size of the light-emission unit 220 in the direction parallel to the base substrate. For example, the above-mentioned θ is 10°, or 15°, or 20°, or 25°. For example, the value of D1/L is 6 to 10. For example, the value of D1/L is 7 to 8.

For example, as shown in FIG. 7, the thickness of the light diffusion structure 300 in the direction perpendicular to the base substrate 210 is greater than (D1*tan θ)/2, and the light diffusion structure 300 is in direct contact with at least part of the light-emission units 220. The above-mentioned direct contact for example refers to the absence of a gap between the light diffusion structure 300 and the at least part of the light-emission units 220. The above-mentioned direct contact for example also refers to that the light diffusion structure 300 is in direct contact with the surface of the encapsulation structure of the light-emission unit 220.

For example, in the case that the thickness of the light diffusion structure 300 is greater than (D1*tan θ)/2, the thickness of the light diffusion structure 300 is greater than the above-mentioned first-stage light mixing distance, and the first-stage light mixing is achieved in the light diffusion structure 300. The light diffusion structure 300 for example is provided in direct contact with the light-emission unit 220, whereby good light homogenization effect is achieved with low probability of the hotspot problem to occur. For example, the thickness H1 of the light-emission unit 220 in the direction perpendicular to the base substrate 210 and the thickness H2 of the light diffusion structure 300 meet: [(D1*tan θ)/2−H1]≤H2≤5 mm. For example, the thickness H2 meets: H2≤4 mm, or H2 is not greater than 3 mm.

In the present disclosure, the position of the light diffusion structure and the thickness of the light diffusion structure are set based on the distance between adjacent light-emission units and the diffusion angle of the light-emission unit in the light-emission board of the display device having different sizes, and the display device is allowed to achieve good high dynamic range (HDR) effect while having a small thickness.

Figure 8:
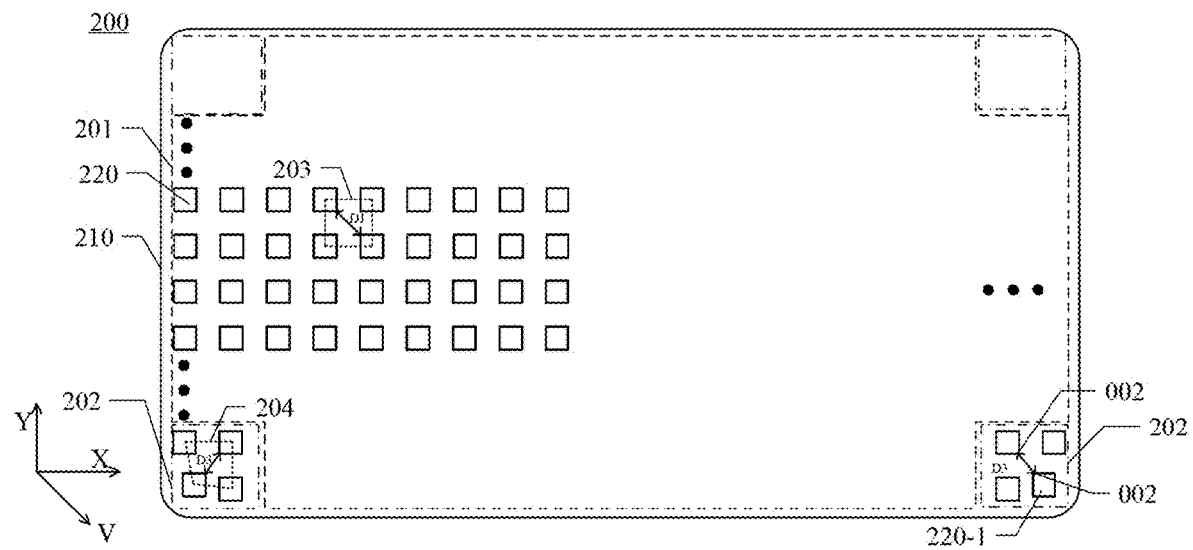
FIG. 8 is a planar schematic view illustrating a partial structure of the light-emission board according to an example of the embodiments of the present disclosure.

FIG. 8. is a schematic view illustrating a partial planar structure of the light-emission board according to an example of the embodiments of the present disclosure. For example, as shown in FIG. 8, the light-emission board 200 includes a first region 201 and a second region 202 located at a periphery of the first region 201. For example, the second region 202 is a corner region of the light-emission board 200. For example, the shape of the display region of the display panel is a rounded rectangle, and regions, corresponding to the corners of the display region, in the light-emission region of the light-emission board 200 are also adapted to rounded corners. The second region 202 for example is a region where one of four rounded corners is located. For example, the arrangement of the light-emission units located in the edge region of the light-emission board is determined according to the shape of the edge region of the display region of the display panel. For example, the shape of the light-emission board is similar or even fully identical to that of the display panel. Of course, the shape of the light-emission board may be different from that of the display panel.

For example, as shown in FIG. 8, the light-emission units 220 located in the first region 201 are arranged in an array in the first direction and the second direction. The distances between two light-emission units 220 provided adjacent to each other and having the largest distance therebetween of respective quadrangles 203 defined by the light-emission units 220 located in the first region 201 for example are same. However, the embodiments of the present disclosure are not limited thereto, the distances between two light-emission units 220 having the largest distance therebetween in different quadrangles in the first region for example are different.

For example, the arrangement of at least part of the light-emission units 220 located in the second region 202 is different from the arrangement of the light-emission units 220 located in the first region 201. For example, there is a case in the second region 202, i.e., two adjacent light-emission units 220 are not arranged in the above-mentioned first direction (e.g., the X-direction), the second direction (e.g., the Y-direction) or the diagonal line (e.g., the V-direction) of the quadrangle.

For example, as shown in FIG. 8, in the second region 202, a connecting line of centers of one light-emission unit 220 and any light-emission unit 220 adjacent thereto passes through two second points 002 in edges, close to each other, of the two light-emission units 220; and a distance between the two second points 002 is smaller than the first distance D1.

For example, a ratio of the distance between the two second points 002 in the second region 202 to the first distance D1 is 0.6 to 0.9. For example, the ratio of the distance between the two second points 002 in the second region 202 to the first distance D1 is 0.7 to 0.8.

For example, as shown in FIG. 8, in the second region 202, the distance between edges, opposite to each other, of one light-emission unit 220 and any light-emission unit 220 adjacent thereto is smaller than the first distance D1. For example, in the second region 202, the distance between the edges, close to each other, of one light-emission unit 220 and any light-emission unit 220 adjacent thereto is smaller than the first distance D1. For example, for the light-emission units 220 in the second region 202, in the quadrangle 204 formed by four light-emission units 220 including three light-emission units 220 immediately adjacent to the edge of the light-emission board, a distance D3 between the edges, opposite to each other, of two light-emission units 220 provided adjacent and having the largest distance therebetween is smaller than the first distance D1.

For example, as shown in FIG. 8, the position arrangement of the light-emission units 220 in the corner region (e.g., the second region 202) of the light-emission board 200 is different from that of the light-emission units 220 in the non-corner region (e.g., the first region 201). For example, the arrangement way of the most adjacent four light-emission units 220 in the corner region of the light-emission board is slightly different from that of the most adjacent four light-emission units 220 in the non-corner region. That is, in the corner region (e.g., the second region 202), the position of the light-emission unit 220-1 located at the outermost corner moves toward the other three light-emission units 220. The above-mentioned most adjacent four light-emission units 220 for example are four light-emission units arranged in a 2*2 array.

For example, the arrangement way of the light-emission units in the light-emission board shown in FIG. 8 is applicable to the display devices shown in the examples of FIG. 6 and FIG. 7.

Figure 9:
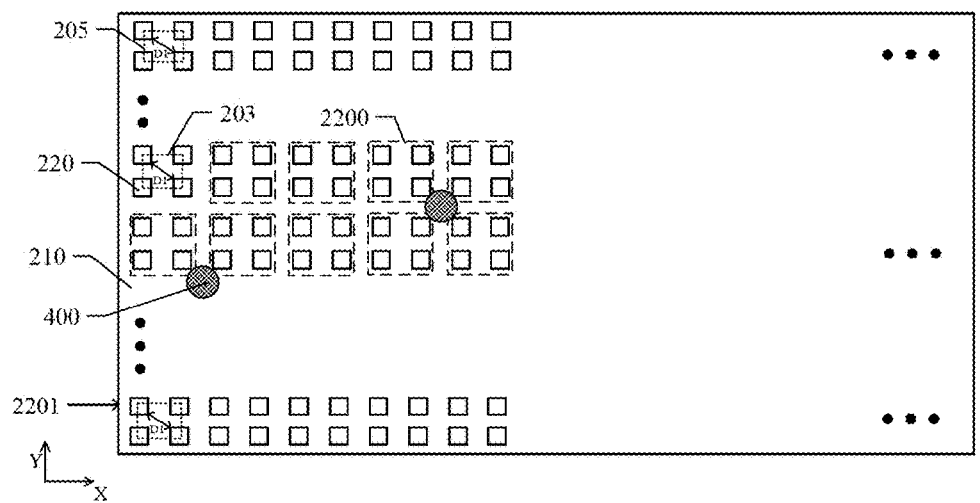
FIG. 9 is a planar schematic view illustrating a partial structure of the light-emission board according to another example of the embodiments of the present disclosure.

FIG. 9 is a schematic view illustrating a partial planar structure of the light-emission board according to another example of the embodiments of the present disclosure. For example, as shown in FIG. 9, the light-emission board 200 includes a plurality of light-emission-unit rows 2201, each of which includes at least two light-emission units 220 arranged in the first direction. The plurality of light-emission-unit rows 2201 are arranged in a direction perpendicular to the first direction. For example, the direction perpendicular to the first direction is the second direction or other directions.

For example, as shown in FIG. 9, four light-emission units 220 in an outermost light-emission-unit row 2201 and a light-emission-unit row 2201 adjacent to the outermost light-emission-unit row 2201 define a quadrangle 205, and the first distance D1 between two light-emission units 220 provided adjacent and having the largest distance therebetween in the quadrangle 205 is smaller than the first distance D1 between two light-emission units 220 provided adjacent and having the largest distance therebetween in other two adjacent light-emission-unit rows 2201.

For example, as shown in FIG. 9, with the direction pointed by the Y-direction being the upward direction, the arrangement way of the most adjacent four light-emission units 220 in the last (or first) light-emission-unit row 2201 and the last but one (or second) light-emission-unit row 2201 is slightly different from the arrangement way of the most adjacent four light-emission units 220 in two adjacent light-emission-unit rows 2201 in the middle region (i.e., the region other than the above-described four light-emission-unit rows 2201). For example, the distance between the last (or first) light-emission-unit row 2201 and the last but one (or second) light-emission-unit row 2201 is smaller than the distance between any adjacent light-emission-unit rows 2201 in the middle region. The distance between rows described herein for example refers to the distance between edges, close to each other, of light-emission units of two adjacent rows. The above-mentioned most adjacent four light-emission units 220 for example are four light-emission units arranged in a 2*2 array.

However, the embodiments of the present disclosure are not limited thereto, and for example, the light-emission board includes a plurality of light-emission-unit columns, each of which includes at least two light-emission units arranged in the second direction. The plurality of-emitting unit columns are arranged in a direction perpendicular to the second direction. The first distance between two light-emission units in an outermost light-emission-unit column and a light-emission-unit column adjacent to the outermost light-emission-unit column is smaller than the first distance between two light-emission units in other two adjacent light-emission-unit columns. For example, the direction perpendicular to the second direction is the first direction or other directions.

For example, the arrangement way of the most adjacent four light-emission units in the last (or first) light-emission-unit column and the last but one (or second) light-emission-unit column is slightly different from the arrangement way of the most adjacent four light-emission units in two adjacent light-emission-unit columns in the middle region (i.e., the region other than the above-described four light-emission-unit columns). For example, the distance between the last (or first) light-emission-unit column and the last but one (or second) light-emission-unit column is smaller than the distance between any adjacent light-emission-unit columns in the middle region. The distance between columns described herein for example refers to the distance between edges, close to each other, of light-emission units of two adjacent columns. The above-mentioned most adjacent four light-emission units for example are four light-emission units arranged in a 2*2 array.

For example, the arrangement way of the light-emission units in the light-emission board shown in FIG. 9 is applicable to the display devices shown in the examples of FIG. 6 and FIG. 7.

The display panel includes a plurality of pixel units, and the distance between adjacent pixel units for example is set according to a resolution limit of the human eyes. The resolution limit of the human eyes is related to a viewing distance. For example, only two adjacent pixel units in the display panel exhibit white, in the case that a viewing distance is 1 m from the human eyes to the display panel, the two pixel units can be distinguished clearly by the human eyes when the distance between the two pixel units is at least 0.291 mm (2*1000 mm*tan(1'/2/60) °=0.291 mm); in the case that the viewing distance is 2 m from the human eyes to the display panel, the two pixel units can be distinguished clearly by the human eyes when the distance between the two pixel units is at least 0.582 mm. When the distance between the two pixel units described above is smaller than a corresponding distance, the two pixel units is regarded as a point or a line segment and cannot be distinguished.

Therefore, for the display device, the smallest distance between two adjacent pixel units should meet that the two adjacent pixel units can be distinguished by the human eyes at least at an optimal viewing distance. The distance between two adjacent pixel units for example is not less than (D*1.22*λ)/d, where D represents a viewing distance to the display surface of the display device; λ represents a wavelength of light most sensitive to human eyes; d represents a pupil diameter of human eyes; the length of the display surface of the display panel is L0, while the width of the display surface of the display panel is W; and D has a value between 3 W and 5 W.

For the display device using the light-emission board according to the above embodiments of the present disclosure as the backlight source, for example, each light-emission unit on the light-emission board corresponds to one pixel unit and provide backlight. However, in an actual product, considering the cost and the process yield, the plurality of light-emission units on the light-emission board are grouped. For example, every 2*2 light-emission units are connected in series as a light-emission-unit group. For example, the plurality of light-emission units in the same light-emission-unit group are connected in series, or connected in parallel, or connected in a combined manner of in-series connection and in-parallel connection. Each light-emission-unit group corresponds to several or tens of, or even hundreds of or thousands of pixel units and provides backlight thereto. Correspondingly, the distance Δy between centers of adjacent light-emission-unit groups is not less than (D*1.22*λ)/d. Correspondingly, any of the length and the width of the region occupied by each light-emission-unit group is not less than (D*1.22*λ)/d.

For example, the total number K of the light-emission-unit groups arranged in the extension direction (e.g., one of the first direction and the second direction) of a long edge (the above-mentioned edge having the length of L0) of the display surface of the display panel is less than L0/Δy, and the total number J of the light-emission-unit groups arranged in the extension direction (e.g., the other one of the first direction and the second direction) of a short edge (the above-mentioned edge having the length of W) of the display surface of the display panel is less than W/Δy.

For example, the pixel units included in the display panel have a resolution of P*Q. and the light-emission board includes K*J light-emission-unit groups. For example, P is exactly divided by K, and Q is exactly divided by J.

For example, as shown in FIG. 4A to FIG. 9, a distance by which a connecting line of centers of any two adjacent light-emission units 220 passes through two points in edges, close to each other, of the any two adjacent light-emission units 220 is not smaller than a minimum distance between the light-emission unit 220 that is outermost on the light-emission board 200 and the edge of the light-emission board 200.

For example, as shown in FIG. 4A to FIG. 9, a distance between edges, close to each other, of any two adjacent light-emission units 220 is not smaller than the minimum distance between the light-emission unit 220 (e.g., the light-emission unit 220-1 shown in FIG. 8) that is outermost on the light-emission board 200 and the edge of the light-emission board 200, so that the brightness around the display region of the display panel can be avoided to the utmost extent from being lower than the brightness of the central region.

Figure 10A:
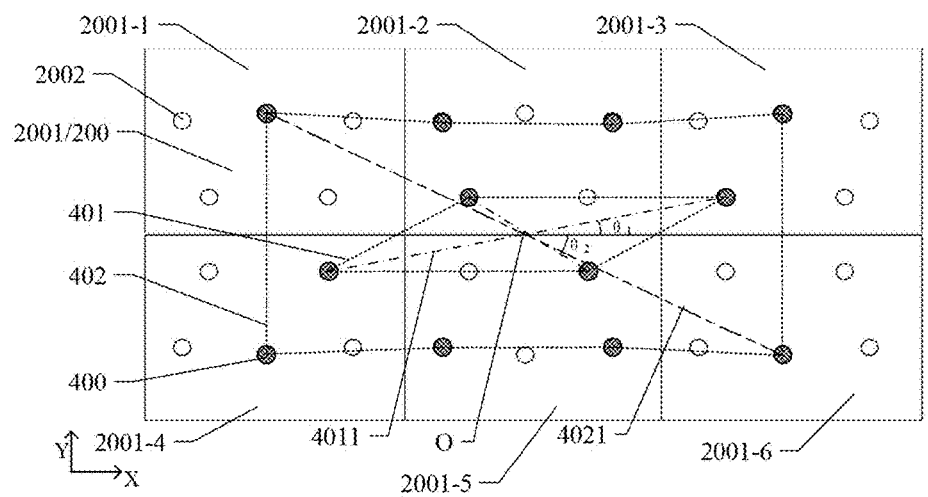
FIG. 10A is a planar schematic view illustrating the light-emission board according to another example of the embodiments of the present disclosure.

FIG. 10A is a planar schematic view of the light-emission board according to another example of the embodiments of the present disclosure. For example, as shown in FIG. 6 and FIG. 10A, a distance is between the light diffusion structure 300 and the light-emission board 200, and a plurality of support portions 400 are provided between the light-emission board 200 and the light diffusion structure 300. For example, the plurality of support portions 400 are provided between the optical film 30 and the light-emission board 200 in the display device shown in FIG. 2. The support portion 400 for example is configured to redirect light emitted from the light-emission unit 220 so that more light is emitted toward a viewing angle right in front of the display panel. The shape of the support portion 400 for example is any desired shape. The shape shown in the figure is merely illustrative, and for example, the cross-section shape of the support portion 400 parallel to the base substrate 210 is a circle or a polygon, and/or the support portion 400 has a round and smooth upper surface.

For example, in the case that the light-emission board 200 of the display device is placed in parallel to the ground, the support portion 400 is configured to support the light diffusion structure 300. For example, in the direction perpendicular to the base substrate 210, the thickness of the support portion 400 is equal to the distance, i.e., the second distance D2, between the light diffusion structure 300 and the base substrate 210.

For example, the thickness of the support portion 400 in the direction perpendicular to the base substrate 210 is smaller than the second distance D2. During the assembly and transportation of the display device, the light diffusion structure is inevitably in contact with the support portion under the action of gravity. For example, when the display device is used, such structures as the light-emission board and the display panel are not placed in parallel to the ground, and instead, for example are placed vertically. Considering coefficients of thermal expansion of respective structures, the height of the support portion for example is smaller than the above-mentioned second distance D2 by 1-2 mm.

For example, as shown in FIG. 6 and FIG. 10A, connecting lines of the plurality of support portions 400 define at least a first polygon 401 and a second polygon 402 parallel to the base substrate 210, where the second polygon 402 surrounds the first polygon 401. For example, the first polygon 401 and the second polygon 402 are the same or different in shape. The "connecting lines of the plurality of support portions 400" described above for example refers to lines for clockwise or anticlockwise sequentially connecting geometrical centers of orthographic projections of the plurality of support portions 400 on the base substrate 210.

For example, as shown in FIG. 6 and FIG. 10A, the first polygon 401 includes a plurality of first diagonal lines 4011, while the second polygon 402 includes a plurality of second diagonal lines 4021; at least two of the plurality of first diagonal lines 4011 pass through a geometrical center O of the light-emission board 200, and/or at least two of the plurality of second diagonal lines 4021 pass through the geometrical center O of the light-emission board 200.

During the assembly and transportation of the display device, the display device for example is laid horizontally. In this case, the light-emission board is located on a side, facing the ground, of the light diffusion structure, and the central position of the light diffusion structure generally is lower than the circumferential position thereof due to the gravity. Thus, by setting the position of the support portion, it is conductive to alleviating the problem that the central position of the light diffusion structure is lower than the circumferential position of the light diffusion structure.

For example, the density of the support portions 400 corresponding to the central region of the light diffusion structure 300 is greater than the density of the support portions 400 corresponding to the edge region of the light diffusion structure 300.

For example, as shown in FIG. 6 and FIG. 10A, the light diffusion structure 300 includes a plurality of layers. For example, the light diffusion structure 300 includes a first light diffusion layer 301 and a second light diffusion layer 302.

For example, for display devices of different sizes including the backlight source, the backlight source includes structures such as the light-emission board provided with the plurality of light-emission units, and the light diffusion structure. The light diffusion structure for example includes two light diffusion layers, such as the first light diffusion layer and the second light diffusion layer. For example, one of the first light diffusion layer 301 and the second light diffusion layer 302 is a particle-based diffusion plate, and the other one of the first light diffusion layer 301 and the second light diffusion layer 302 is a diffusion layer having a microstructured surface. For example, the thickness of the second light diffusion layer 302 is smaller than the thickness of the first light diffusion layer 301. However, the embodiments of the disclosure are not limited thereto, the light diffusion structure for example includes three or more light diffusion layers.

For example, the particle-based diffusion layer is formed by adding chemical particles as scattering particles to a base layer, allowing light rays to be continuously refracted, reflected and scattered between substances having different refractive indices when passing through the light diffusion layer and thereby producing the effect of optical diffusion. For example, the thickness of the particle-based diffusion layer is 1.5 mm, 2 mm, 2.5 mm or 3 mm. The greater the thickness is, the better the light homogenization effect is but the greater the brightness loss is. The above-mentioned base layer for example includes polymethyl methacrylate (PMMA), polycarbonate (PC), polystyrene (PS), polypropylene (PP) and the like.

For example, the diffusion layer having the microstructured surface is provided with micro-feature structures arranged in periodic arrays on the surface of the base layer through a imprinting process, allowing light rays to be refracted in different directions when passing through the micro-feature structures and changing the traveling path of light. As a result, the incident light is fully scattered to achieve softer and more homogeneous diffusion effect. The thickness of the diffusion layer for example is 90-100 μm. The above-mentioned base layer for example includes polymethyl methacrylate (PMMA), polycarbonate (PC), polystyrene (PS), polypropylene (PP) and the like.

For example, any one of the plurality of layers has an area of S0 and the first polygon 401 has an area of S1, and S0 and S1 meet: $S0/S1 \geq 16$. An area ratio of the light diffusion structure to the first polygon is adjusted, thereby achieving good support effect of the support portion for the central region of the light diffusion structure.

For example, the area of the layer 302 is 293560 mm$^2$, and the area of the first polygon 401 is 17873 mm$^2$. For example, the area of the layer 302 is 46818 mm$^2$, and the area of the first polygon 401 is 2772 mm$^2$.

For example, as shown in FIG. 6 and FIG. 10A, the second polygon 402 has an area of S2, and S0 and S2 meet: $S0/S2 \geq 2$. The relative positional relationship of the support portion and the light diffusion structure is adjusted by adjusting an area ratio of the light diffusion structure to the second polygon, thereby achieving good support effect of the support portion for the edge region of the light diffusion structure.

For example, the area of the layer 302 is 293560 mm$^2$, and the area of the second polygon 402 is 144810 mm$^2$. For example, the area of the layer 302 is 46818 mm$^2$, and the area of the second polygon 402 is 17728 mm$^2$.

Figure 11:
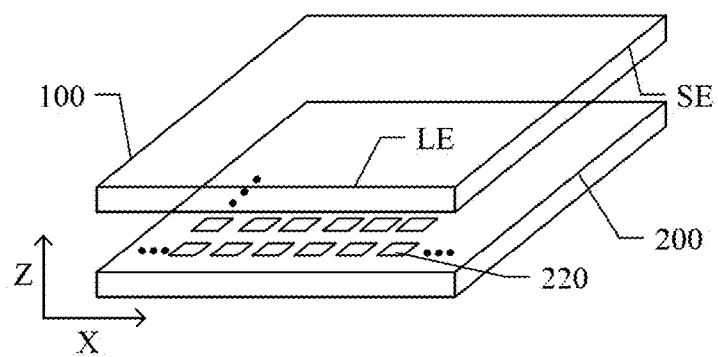
FIG. 11 is a schematic view illustrating the display device including the light-emission board shown in FIG. 6 and FIG. 10A.

FIG. 11 is a schematic view of the display device including the light-emission board shown in FIG. 6 and FIG. 10A. FIG. 11 schematically illustrates stacking of the display panel and the light-emission board. For example, as shown in FIG. 6, FIG. 10A and FIG. 11, a planar shape, parallel to the base substrate 210, of the display panel 100 is a quadrangle. The display panel 100 includes two long edges LE and two short edges SE that are connected alternately.

For example, as shown in FIG. 6, FIG. 10A and FIG. 11, an included angle between the longest one of the plurality of first diagonal lines 4011 and a straight line parallel to the long edges LE (e.g., a straight line parallel to the X-direction) is a first included angle $\theta1$; and the first included angle $\theta1$ is the smallest one of a plurality of included angles between the plurality of first diagonal lines 4011 and the above-mentioned straight line.

For example, as shown in FIG. 6, FIG. 10A and FIG. 11, an included angle between the shortest one of the plurality of first diagonal lines 4011 and the above-mentioned straight line is a second included angle θ2; and the second included angle θ2 is the largest one of a plurality of included angles between the plurality of first diagonal lines 4011 and the above-mentioned straight line. The size of the first polygon in the direction parallel to the long edge of the display panel is greater than the size of the first polygon in the direction parallel to the short edge of the display panel. The display panel has relatively large deformation in the direction of the long edge thereof. According to the finite element analysis of force, adjusting the positions of the support portions, the distance between the support portions and the density of the support portions is conductive to the support of the support portions for the light diffusion structure and the display panel.

For example, as shown in FIG. 10A, the light-emission board 200 includes a plurality of light-emission sub-boards 2001; and at least one support portion 400 is provided on each light-emission sub-board 2001. For example, the size of the light-emission board 200 is almost the same as the size of the display panel 100. In the case that a PCB is used as the base substrate 210 of the light-emission board 200, due to the limitations of the properties of the material of the PCB and the manufacture process of the PCB, one single PCB cannot be used as the base substrate of the light-emission board 200 in the large-size display device. Therefore, a plurality of PCBs need to be spliced together. For example, the base substrate 210 of the light-emission board 200 is a glass substrate. For the large-size display device, although the base substrate of the light-emission board can be formed by one single glass substrate, a plurality of pieces of glass substrates for example are spliced together as the base substrate in consideration of factors such as the yield of a light-emission diode binding process, the convenience of repair and the cost.

For example, the light-emission board 200 includes six light-emission sub-boards 2001 that are arranged in a 2*3 array or a 3*2 array. For example, the size of each light-emission sub-board 2001 is 331.85 mm*393 mm. For example, the size of each light-emission sub-board 2001 is 131.6 mm*354.4 mm. For example, the light-emission board 200 includes a first light-emission sub-board 2001-1, a second light-emission sub-board 2001-2, a third light-emission sub-board 2001-3, a fourth light-emission sub-board 2001-4, a fifth light-emission sub-board 2001-5 and a sixth light-emission sub-board 2001-6.

For example, a plurality of reserved positions 2002 are provided at a side, facing the light diffusion structure 300, of each light-emission sub-board 2001, and the support portion 400 is provided at at least one reserved position 2002 of each light-emission sub-board 2001. For example, the total number of the reserved positions 2002 of each light-emission sub-board 2001 is greater than the total number of the support portions 400 provided on each light-emission sub-board 2001.

For example, the plurality of reserved positions 2002 provided on different light-emission sub-boards 2001 are the same in total number and relative positional relationship, thereby facilitating the arrangement of the support portions and the batch production of the light-emission sub-boards. For example, the total number of the reserved positions 2002 provided on the first light-emission sub-board 2001-1 is the same as the total number of the reserved positions 2002 provided on the fourth light-emission sub-board 2001-4, and the reserved positions 2002 provided on the first light-emission sub-board 2001-1 and the reserved positions 2002 provided on the fourth light-emission sub-board 2001-4 are of symmetrical distribution with respect to a central axis in the X-direction. For example, the total number of the reserved positions 2002 provided on the first light-emission sub-board 2001-1 is the same as the total number of the reserved positions 2002 provided on the sixth light-emission sub-board 2001-6, and the reserved positions 2002 provided on the first light-emission sub-board 2001-1 and the reserved positions 2002 provided on the sixth light-emission sub-board 2001-6 are of centrosymmetric distribution with respect to the geometrical center.

FIG. 10A schematically illustrates that the shape of the first polygon 401 is a parallelogram, and the support portions 400 are respectively provided at the positions of the four endpoints of the parallelogram. However, the embodiments of the disclosure are not limited thereto, the support portions for example are provided at the reserved positions 2002 on any edge of the first polygon 401 to further increase the support effect of the support portions.

For example, as shown in FIG. 10A, at least two support portions 400 having an identical and minimum distance to the geometrical center O are located on different light-emission sub-boards 200, respectively, and the at least two support portions 400 constitutes at least one vertex of the first polygon 401. For example, the above-mentioned at least two support portions 400 having the identical and minimum distance to the geometrical center O include two support portions 400 that are of centrosymmetric distribution with respect to the geometrical center O. For example, the above-mentioned at least two support portions 400 include the support portions 400 located at the vertices of the first polygon 4011, or include the support portions 400 located on the edges of the first polygon 4011. The support portions close to the geometrical center for example are adjusted to be located on different light-emission sub-boards so that a distributed support effect of the support portions can be achieved. Thus, the total number of the support portions are reduced while good support effect for the light diffusion structure is achieved.

For example, the at least two support portions 400 having the identical and minimum distance to the geometrical center O are two support portions 400 located at the two endpoints of the shortest first diagonal line 4011 of the first polygon 401, and the two support portions 400 are of centrosymmetric distribution with respect to the geometrical center O.

For example, as shown in FIG. 10A, at least one support portion 400 provided on each light-emission sub-board 2001 constitutes the vertex of the second polygon 402. For example, a plurality of support portions 400 are provided on each light-emission sub-board 2001. The support portions 400 provided on each light-emission sub-board 2001 for example include the support portion 400 located at the vertex of the second polygon 402, and for example also includes the support portion 400 located on the edge of the second polygon 402.

For example, the light-emission units 220 in the light-emission board 200 shown in FIG. 6 are arranged as shown in FIG. 9, without limitation, or are arranged as shown in FIG. 8. For example, as shown in FIG. 6, FIG. 9 and FIG. 10A, four light-emission units 220 defining the quadrangle 203 constitute a light-emission-unit group 2200. The support portion 400 is located between adjacent light-emission-unit groups 2200, thereby reducing the influence of the support portion on the light effect of the light-emission units in each light-emission-unit group.

For example, the back frame 43 shown in FIG. 2 protects and supports the light-emission board 200, or has a certain heat dissipation function. For example, the light-emission board 200 further includes a plurality of screw holes. Screws configured to fix the base substrate 210 and the back frame 43 for example are provided in the screw holes. For example, the screw holes are distributed between adjacent light-emission-unit groups, thereby reducing the influence of the screw holes on the light effect of the light-emission units in each light-emission-unit group.

For example, as shown in FIG. 10A, the reserved position 2002 includes a through hole penetrating through the base substrate 210. For example, the ratio of the area of each reserved position 2002 to the area of each screw hole is 0.9 to 1.1. For example, the area of each reserved position 2002 is equal to the area of each screw hole. For example, the area of each reserved position 2002 is 14.56 mm$^2$, and the area of each screw hole is 14.522 mm$^2$. By setting the area of the through hole of the reserved position to be substantially equal to the area of the screw hole, different holes can be distinguished easily during mounting, and the efficiency and the yield can be improved. Also, the difference in the influence on the light effect of the light-emission-unit group due to different hole areas for example is reduced.

For example, the screw hole is a circular through hole. For example, the through hole at the reserved position is a vertical elliptical through hole. The "vertical" used herein for example refers to the direction parallel to the thickness direction of the display panel. For example, the base substrate for example is further provided with positioning holes that include a transverse elliptical through hole and a circular through hole. The "transverse" used herein for example refers to the direction parallel to the long edge of the display panel.

For example, as shown in FIG. 10A, the plurality of light-emission sub-boards 2001 are arranged in an array in the first direction (e.g., the X-direction shown in FIG. 10A) and the second direction (e.g., the Y-direction shown in FIG. 10A), and at least part of structures on the plurality of light-emission sub-boards 2001 are of centrosymmetric distribution with respect to the geometrical center O of the light-emission board 200.

For example, the support portions 400 on the plurality of light-emission sub-boards 2001 are of centrosymmetric distribution with respect to the geometrical center O of the light-emission board 200. For example, the support portion 400 on the third light-emission sub-board 2001-3 and the support portion 400 on the fourth light-emission sub-board 2001-4 are of centrosymmetric distribution with respect to the geometrical center O of the light-emission board 200. For example, the support portion 400 on the first light-emission sub-board 2001-1 and the support portion 400 on the sixth light-emission sub-board 2001-6 are of centrosymmetric distribution with respect to the geometrical center O of the light-emission board 200. For example, the support portion 400 on the second light-emission sub-board 2001-2 and the support portion 400 on the fifth light-emission sub-board 2001-5 are of centrosymmetric distribution with respect to the geometrical center O of the light-emission board 200.

Figure 10B:
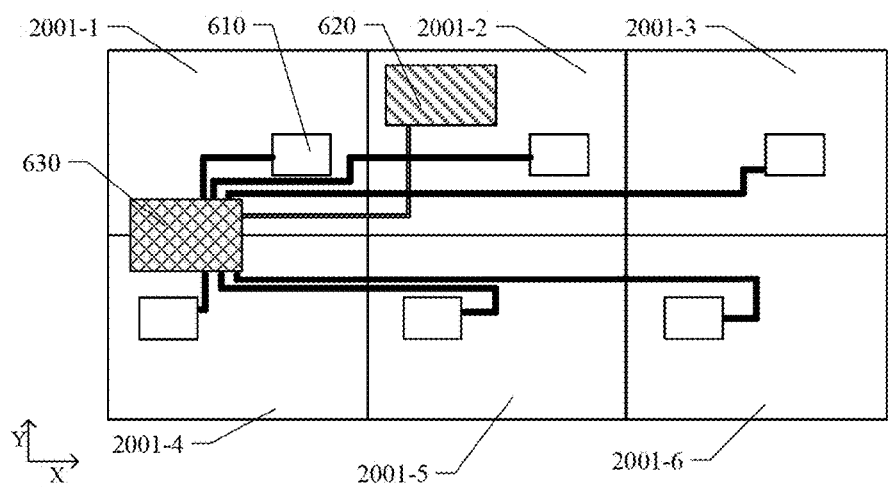
FIG. 10B is a schematic view illustrating a side, on which a light-emission unit is not provided, of a light-emission sub-board shown in FIG. 10A.

FIG. 10B is a schematic view of a side, on which the light-emission unit is not provided, of the light-emission sub-board shown in FIG. 10A. For example, as shown in FIG. 10B, a driving circuit 610 is provided on the side (e.g., a rear surface), on which no light-emission unit is provided, of each light-emission sub-board 2001. A plurality of driving circuits 610 on the plurality of light-emission sub-board 2001 are of centrosymmetric distribution with respect to the geometrical center O of the light-emission board 200 so that the difference in the lengths of wires in different driving circuits are reduced as much as possible.

For example, the display device further includes a converter 630 and a timing controller (TCON) 620. The timing controller 620 is configured to generate and provide a driving control signal to the converter 630, and the converter 630 is configured to convert and divide the driving control signal into a plurality of control signals that are respectively provided to the driving circuit 610 on each light-emission sub-board 2001. The driving circuit 610 then accurately distributes the signal corresponding to each light-emission-unit group. For example, the driving circuit 610 on each light-emission sub-board 2001 is electrically connected to the converter 630. The plurality of light-emission sub-boards are of centrosymmetric distribution with respect to the geometrical center, thereby being conducive to the arrangement of the converter and the driving circuit on each light-emission sub-board. The difference in the lengths of connecting wires is reduced as much as possible to avoid the generation of large signal delay on the wires. Each light-emission sub-board 2001 includes at least one driving circuit 610 thereon. The driving circuit 610 for example is an integrated circuit, a flexible printed circuit, a chip on film, a programmable logic array, a thin film transistor, a combination thereof, etc.

Figure 12:
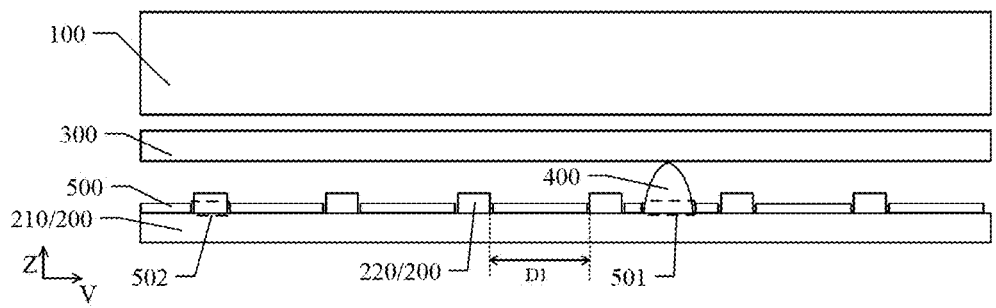
FIG. 12 a cross-sectional schematic view illustrating a partial structure of the display device according to an example of the embodiments of the present disclosure.
Figure 13A:
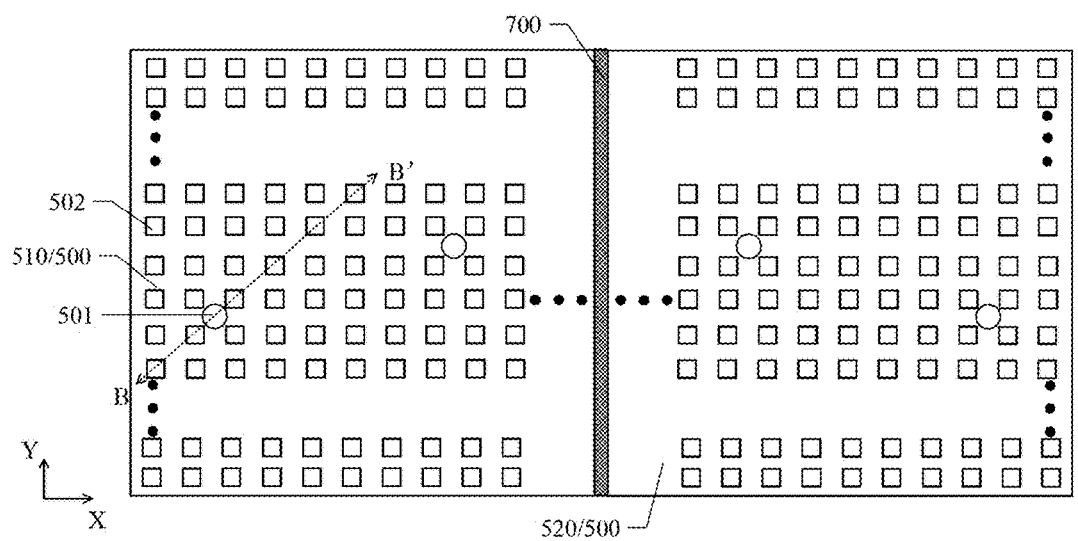
FIG. 13A is a planar schematic view illustrating a structure of a reflective film in the display device shown in FIG. 12.

FIG. 12 is a schematic view illustrating a partial cross-sectional structure of the display device according to an example of the embodiments of the present disclosure, and FIG. 13A is a schematic view illustrating a planar structure of a reflective film in the display device shown in FIG. 12. The reflective film in FIG. 12 is a cross-sectional view taken along line BB' shown in FIG. 13A. The distance between the light-emission board 200 and the light diffusion structure 300 shown in FIG. 12 for example is identical to the distance between the light-emission board 200 and the light diffusion structure 300 in the display device shown in FIG. 6. For example, as shown in FIG. 12, the display device further includes the reflective film 500 located between the base substrate 210 and the light diffusion structure 300. The display panel 100, the light diffusion structure 300 and the light-emission board 200 shown in FIG. 12 for example have the same features as the display panel 100, the light diffusion structure 300 and the light-emission board 200 in the display device shown in FIG. 6, which will not be described here for simplicity.

For example, as shown in FIG. 12 and FIG. 13A, the reflective film 500 includes a plurality of first openings 501 configured to expose at least part of the plurality of reserved positions. For example, the first opening 501 is configured that the support portion 400 passes through the first opening 501.

For example, as shown in FIG. 12 and FIG. 13A, the reflective film 500 further includes a plurality of second openings 502 configured to expose at least part of the plurality of light-emission units 220.

For example, the reflective film 500 further includes openings configured to expose the screw holes, openings configured to expose the positioning holes, etc. For example, the reflective film 500 covers the screw holes, the positioning holes, etc., to avoid exposure thereof. The above arrangement for example is selected according to actual products, which will not be limited in the embodiments of the present disclosure.

For example, the plurality of openings of the reflective film 500 only expose the light-emission units 220, and such structures as the reserved positions and the screw holes that must be exposed, and therefore, the overall reflectivity of the reflective film is increased as much as possible.

For example, as shown in FIG. 13A, the reflective film 500 includes two reflective sub-films 510 and 520. A gap is provided between the two reflective sub-films 510 and 520, and therefore, a gap is reserved for thermal expansion of the reflective film. For example, a reflective strip 700 is independently attached to the gap between the two reflective sub-films. For example, as shown in FIG. 10A and FIG. 13A, the reflective sub-film 510 is attached to the first light-emission sub-board 2001-1, the fourth light-emission sub-board 2001-4, a portion of the second light-emission sub-board 2001-2 and a portion of the fifth light-emission sub-board 2001-5, and the reflective sub-film 520 is attached to the third light-emission sub-board 2001-3, the sixth light-emission sub-board 2001-6, a portion of the second light-emission sub-board 2001-2 and a portion of the fifth light-emission sub-board 2001-5.

For example, the reflective film 500 includes a plurality of layers. For example, the reflective film 500 includes a white ink and/or a reflective sheet provided on the base substrate 210. For example, the white ink is applied using a patterning process before binding the light-emission units and mounting the support portions; the reflective sheet is provided on the light-emission board in an attachment manner after mounting and fixing the light-emission units and the support portions. For example, the material of the reflective strip 700 is the same as that of the reflective film.

For example, the reflective film 500 shields a test point on the light-emission board 200 as much as possible. For example, the test point is configured to test the properties such as electrical properties of the light-emission unit.

Figure 13B:
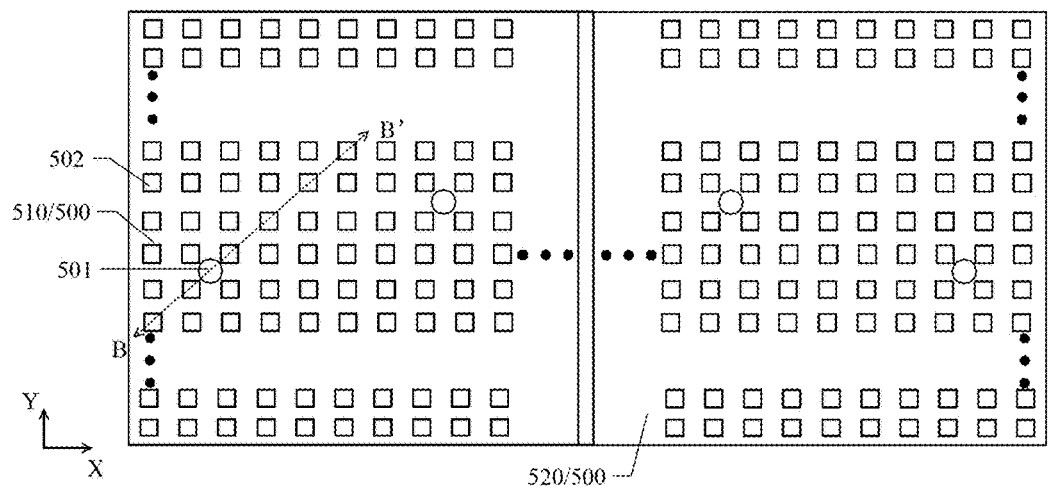
FIG. 13B is a schematic view illustrating the reflective film according to another example of the embodiments of the present disclosure.

FIG. 13B is a schematic view illustrating the reflective film in another example of the embodiments of the present disclosure. As shown in FIG. 13B, the reflective film 500 includes two reflective sub-films 510 and 520 that partially overlap with each other. Except that the relative positional relationship of the two reflective sub-films shown in FIG. 13B is different from that of the two reflective sub-films shown in FIG. 13A, the reflective film shown in FIG. 13B for example has the same features as the reflective film shown in FIG. 13A, which will not be described here for simplicity.

Figure 14A:
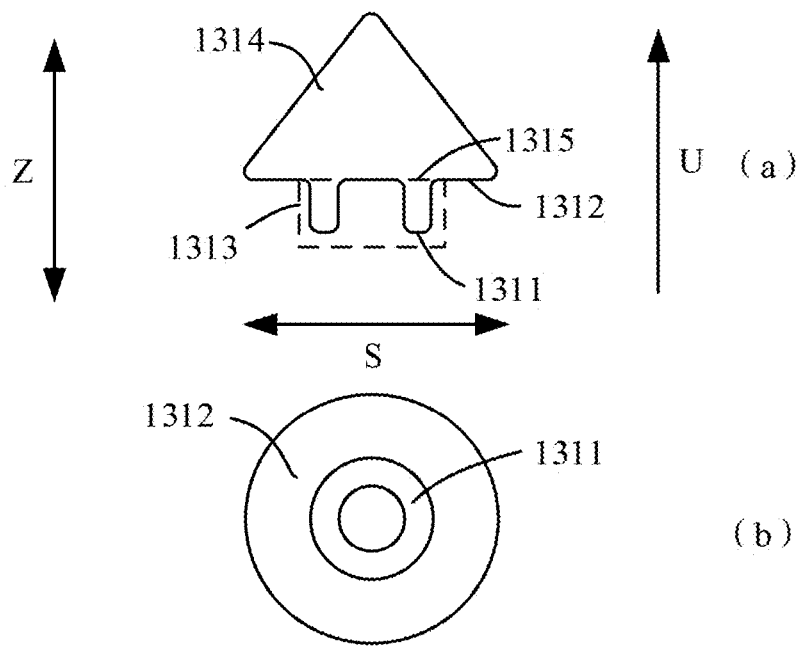
FIG. 14A is a structural view of a support portion according to the embodiments of the present disclosure.
Figure 14B:
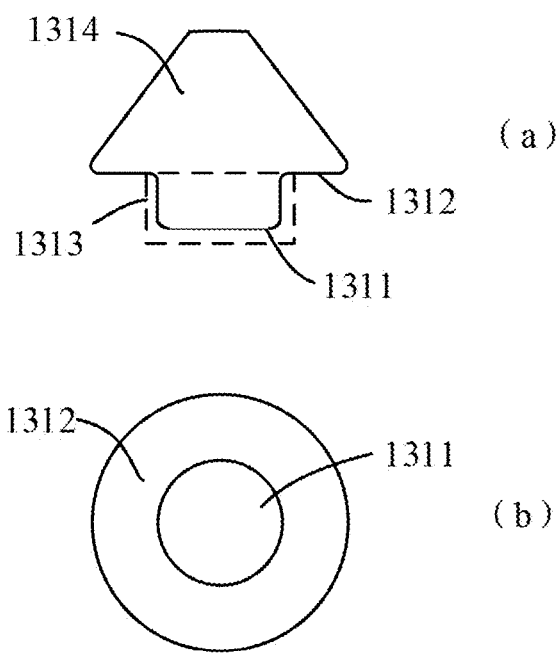
FIG. 14B is another structural view illustrating the support portion according to the embodiments of the present disclosure.
Figure 14C:
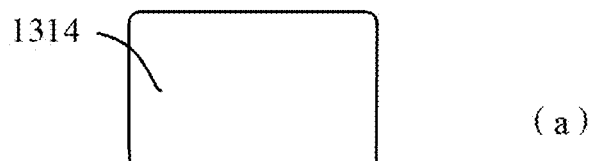
FIG. 14C is further another structural view illustrating the support portion according to the embodiments of the present disclosure.
Figure 14C:
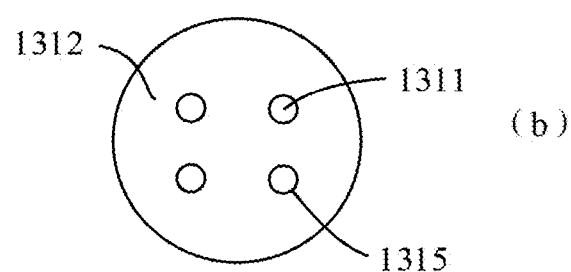
Figure 14D:
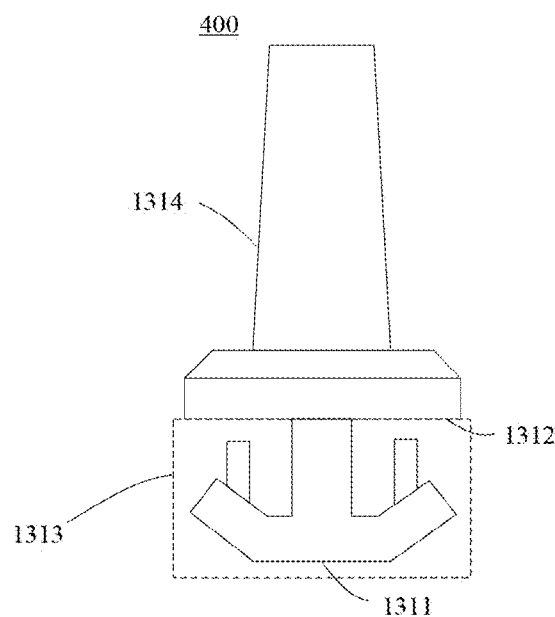
FIG. 14D is further another structural view illustrating the support portion according to the embodiments of the present disclosure.
Figure 15A:
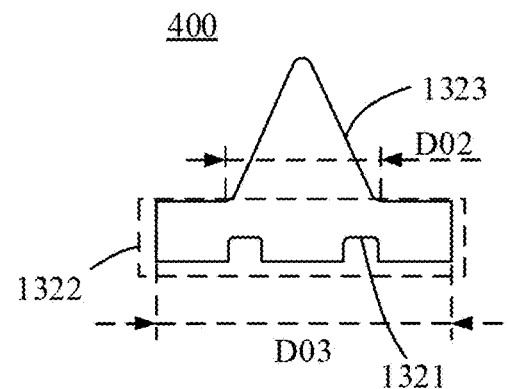
FIG. 15A is further another structural view illustrating the support portion according to the embodiments of the present disclosure.
Figure 15B:
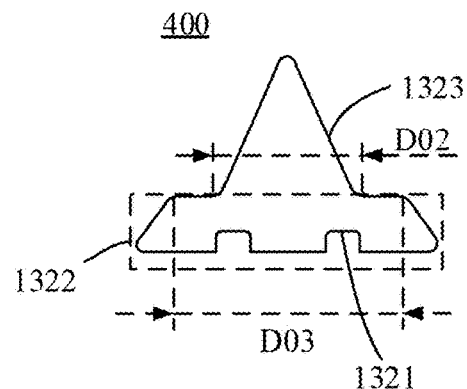
FIG. 15B is further another structural view illustrating the support portion according to the embodiments of the present disclosure.

FIG. 14A is a structural view of the support portion according to some embodiments of the present disclosure; FIG. 14B is a structural view of another support portion according to some embodiments of the present disclosure; FIG. 14C is a structural view of further another support portion according to some embodiments of the present disclosure; FIG. 14D is a structural view of further another support portion according to some embodiments of the present disclosure; FIG. 15A is a structural view of further another support portion according to some embodiments of the present disclosure; and FIG. 15B is a structural view of further another support portion according to some embodiments of the present disclosure.

For example, as shown in FIG. 14A, the support portion 400 includes a pedestal 1313 provided in the first opening of the reflective film, and a first main body portion 1314 located on a side, facing away from the base substrate, of the pedestal 1313 and connected to the pedestal 1313.

By mounting the pedestal 1313 of the support portion 400 into the first opening of the reflective film, the displacement of the support portion 400 in the direction parallel to the base substrate is limited, thereby guaranteeing the distribution uniformity of the support portions 400 in the direction parallel to the base substrate. Thus, the difference in the deformation quantities of different regions of the optical layer included in the light diffusion structure supported by the support portion 400 is reduced, and the surface flatness of the optical layer is improved to guarantee its optical properties. The first main body portion 1314 of the support portion 400 is configured for supporting the optical layer to reduce the deformation quantity of the optical layer under stress.

For example, as shown in FIG. 14A, a surface, facing away from the first main body portion 1314, of the pedestal 1313 is a first bottom surface 1311, and a surface, connected with the first main body portion 1314, of the pedestal 1313 is a first top surface 1315. A surface, connected with the pedestal 1313, of the first main body portion 1314 is a second bottom surface 1312. The orthographic projection of the second bottom surface 1312 on the base substrate covers the orthographic projection of the first top surface 1315 on the base substrate so that the pedestal 1313 and the first main body portion 1314 constitute a step surface. The thickness of the pedestal 1313 in the direction perpendicular to the base substrate is smaller than or equal to the depth of the first opening of the reflective film.

For example, because of the step surface constituted by the first bottom surface 1311 and the second bottom surface 1312, the first bottom surface 1311 is caused to abut against a surface of a certain layer on the light-emission board and the second bottom surface 1312 is caused to abut against a surface of the reflective film, so that the support portion 400 is limited. The mounting height of respective support portion 400 is adjusted so that the uniformity of the mounting heights of the support portions 400 are improved. As a result, the support heights of the support portions 400 for the corresponding regions of the optical film are allowed to be roughly equal and the deformation quantities of different regions of the optical film are allowed to be roughly equal, thereby being conducive to improving the surface flatness of the optical film to guarantee the optical properties thereof.

For example, the orthographic projection of the second bottom surface 1312 of the support portion 400 on the base substrate covers the orthographic projection of the corresponding first opening on the base substrate so that the second bottom surface 1312 of the support portion 400 shields the first opening. The reduction of the reflection area of the reflective film due to the formation of the first openings in the reflective film is avoided, thereby avoiding the adverse influence on the overall luminous efficiency of the light-emission board and the display effect of the display device.

For example, in the thickness direction Z of the base substrate and in the direction U from the pedestal 1313 to the first main body portion 1314, the area of the cross-section of the first main body portion 1314 in the direction S parallel to the base substrate decreases gradually.

In the above-mentioned arrangement manner, under the conditions of keeping the area of the second bottom surface 1312 of the first main body portion 1314 unchanged, the volume of the first main body portion 1314 is reduced, thereby reducing the blocking effect of the first main body portion 1314 of the support portion 400 on light rays and increasing the amount of light emitted in the thickness direction Z of the base substrate. Thus, the luminous efficiency of the light-emission board is improved.

For example, as shown in FIG. 14A, the first main body portion 1314 of the support portion 400 includes a plurality of cross-sections in the direction S parallel to the base substrate, and at least one cross-section has an area larger than or equal to an area of a cross-section provided on a side, facing away from the base substrate, of the at least one cross-section.

For example, as shown in FIG. 14A, the shape of the first main body portion 1314 of the support portion 400 is a cone. As shown in FIG. 14B, the shape of the first main body portion 1314 of the support portion 400 is a circular truncated cone. As shown in FIG. 14C, the shape of the first main body portion 1314 of the support portion 400 for example is a cylinder.

In some embodiments, the support portion 400 is of a structure shown in FIG. 14D. The pedestal 1313 of the support portion 400 is a clasp that includes the first bottom surface 1311 close to the base substrate. The first main body portion 1314 of the support portion 400 includes a seat connected to the clasp, and a circular truncated cone connected to the seat and located on a side, facing away from the clasp, of the seat, and the seat includes the second bottom surface 1312 connected to the clasp.

For example, the reserved position of the base substrate of the light-emission board includes the through hole. The pedestal 1313 of the support portion 400 shown in FIG. 14D extends through and is fastened to the through hole of the base substrate to realize the fixation of the support portion 400. However, the embodiments of the disclosure are not limited thereto, the support portion for example is bonded to the base substrate, and no through hole is formed in the reserved position.

For example, a fixing layer is provided in the first opening of the reflective film. At least a portion of the pedestal 1313 of the support portion 400 is embedded into and connected to the fixing layer so that the support portion 400 is fixed to the base substrate through the fixing layer.

For example, in the case that the fixing layer is uncured, the pedestal 1313 of the support portion 400 is embedded into the fixing layer, causing part of glue for forming the fixing layer to overflow from the first opening. The glue for example is present between the second bottom surface 1312 of the support portion 400 and the reflective film, and this part of glue has a small thickness after being cured, with the thickness ranging from 0 to 10 microns.

The pedestal 1313 of the support portion 400 extends into the fixing layer so that the bonding area of the support portion 400 with the fixing layer is increased, improving the bonding strength of the support portion 400 with the fixing layer. Moreover, the bonding strength of the support portion 400 with the fixing layer for example is further improved by increasing the bonding area of the pedestal 1313 of the support portion 400 with the fixing layer. For example, the support portion 400 in FIG. 14A is used and the pedestal 1313 is of a hollow cylindrical structure so that the interior of the pedestal 1313 is also bonded to the fixing layer.

For example, as shown in FIG. 14A, the orthographic projection of the pedestal 1313 of the support portion 400 on the base substrate has an annular shape. That is, the pedestal 1313 is of the hollow cylindrical structure. For example, as shown in FIG. 14B, the shape of the pedestal 1313 is a cylinder. For example, as shown in FIG. 14C, the pedestal 1313 includes a plurality of protrusions 1315 protruding from the second bottom surface 1312 to the base substrate.

For example, as shown in FIG. 15A, the support portion 400 includes the pedestal 1322, and a second main body portion 1323 located on a side, facing away from the base substrate, of the pedestal 1322 and connected to the pedestal 1322. At least one groove 1321 is provided at a surface, close to the base substrate, of the pedestal 1322, and a radial size D02 of the orthographic projection of a surface, close to the pedestal 1322, of the second main body portion 1323 is smaller than a radial size D03 of the orthographic projection of a surface, close to the second main body portion 1323, of the pedestal 1322.

For example, as shown in FIG. 15A, the radial size D02 of the orthographic projection of the surface, close to the pedestal 1322, of the second main body portion 1323 is smaller than the radial size D03 of the orthographic projection of the surface, close to the second main body portion 1323, of the pedestal 1322. The shape of the pedestal 1322 of the support portion 400 is a cylinder, and the shape of the second main body portion 1323 is a cone. Equivalently, on the basis of the cylinder, part of the cylinder is removed to obtain a small-volume support portion 400. Thus, the blocking effect of the support portion 400 for light rays is reduced.

For example, as shown in FIG. 15B, the radial size D02 of the orthographic projection of the surface, close to the pedestal 1322, of the second main body portion 1323 is smaller than the radial size D03 of the orthographic projection of the surface, close to the second main body portion 1323, of the pedestal 1322. The shape of the pedestal 1322 of the support portion 400 is a circular truncated cone, and the shape of the second main body portion 1323 is a cone. Equivalently, on the basis of the cone, part of the cone is removed to obtain a small-volume support portion 400. Thus, the blocking effect of the support portion 400 for light rays is reduced.

For example, a surface, close to the base substrate, of the support portion 400 is fixedly connected to the base substrate by means of the fixing layer.

For example, the fixing layer is provided in the first opening of the reflective film, and the surface, close to the base substrate, of the support portion 400 is fixedly connected to the base substrate by means of the fixing layer.

For example, the support portion 400 is provided on a side, facing away from the base substrate, of the reflective film and the fixing layer is provided between the support portion 400 and the reflective film. The surface, close to the base substrate, of the support portion 400 is fixedly connected to the base substrate by means of the fixing layer. For example, the thickness of the fixing layer is set to be small and ranges from 30 μm to 100 μm, e.g., 30 μm, 40 μm, 65 μm, 80 μm or 100 μm, so that the bonding strength of the support portion 400 with the fixing layer is improved.

For example, the maximum radial size of the support portion 400 ranges from 2 mm to 10 mm. For example, the height of the support portion 400 ranges from 1 mm to 12 mm.

Figure 16:
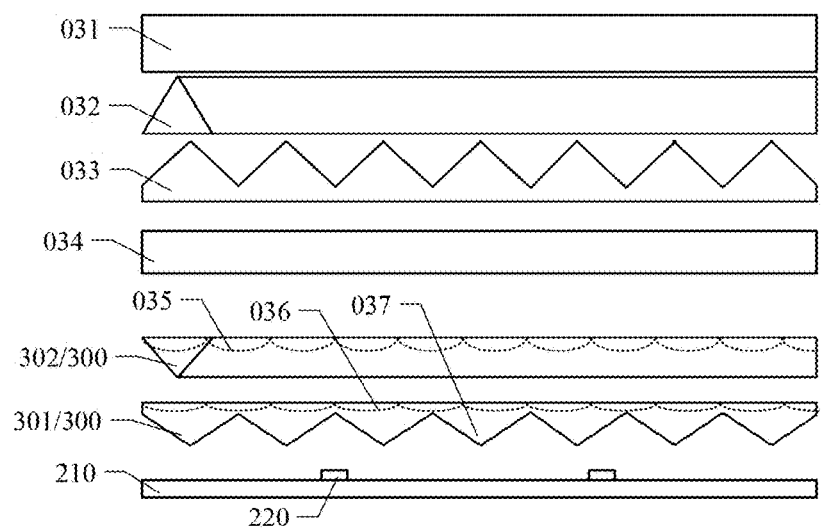
FIG. 16 is a schematic view illustrating the light-emission board and at least part of structures provided on a side, facing a display panel, of the light-emission board in the display device shown in FIG. 4A or FIG. 6.

FIG. 16 is a schematic view illustrating the light-emission board and at least part of structures provided a side, facing the display panel, of the light-emission board in the display device shown in FIG. 4A or FIG. 6. As shown in FIG. 16, a diffusing layer 031, brightness enhancement layers 032 and 033 and a color conversion layer 034 are further provided between the light diffusion structure 300 and the display panel.

For example, as shown in FIG. 16, a surface, facing away from the light-emission board 200, of the brightness enhancement layer 033 includes a protrusion. For example, the brightness enhancement layer 033 is a prism layer that has a function in condensing light and increasing the light emission brightness at the viewing angle right in front of the display device. For example, the brightness enhancement layer 032 is an additional brightness enhancement layer provided on a side, facing away from the light-emission board 200, of the brightness enhancement layer 033 to further collimate the light rays from the backlight source, thereby increasing the brightness of the display device.

For example, as shown in FIG. 16, the color conversion layer 034 is located between the brightness enhancement layer 033 and the light diffusion structure 300. For example, the color conversion layer 034 converts the color of the light from the light-emission unit. For example, the light-emission unit emits blue light, the color conversion layer 034 includes a phosphor layer that converts the blue light into white light. For example, the phosphor layer includes quantum dots that convert the blue light into red light and green light. For example, in addition to the phosphor layer, the color conversion layer 034 includes a partially reflective layer. For example, the partially reflective layer (also referred to as a dichroic layer or a dichroic filter layer) reflects all of the red light and green light and reflects part of the blue light.

For example, as shown in FIG. 16, the layer 301 and the layer 302 are attached using an adhesive. For example, the layer 301 and the layer 302 are pressed together to form an overall structure. For example, the layer 302 has an upper surface with a micro-lens 036. The micro-lens 036 for example is formed by a plurality of grooves at a surface, facing away from the light-emission board 200, of the layer 302. For example, the layer 301 has a plurality of protrusions 037 protruding toward the light-emission board 200. For example, the layer 301 has an upper surface with a micro-lens 035. The micro-lens 035 for example is formed by a plurality of grooves at a surface, facing away from the light-emission board 200, of the layer 301. The micro-lens 035 reduces the internal total reflection.

The following points need to be noted:
(1) The accompanying drawings in the embodiments of the present disclosure involve only structures involved in the embodiments of the present disclosure, and other structures may be designed as usual.
(2) Features in the same embodiment and those in different embodiments of the present disclosure may be combined with one another without conflict.

The foregoing are merely descriptions of the exemplary embodiments of the present disclosure and do not intend to limit the protection scope of the present disclosure. The protection scope of the present disclosure is defined by the appended claims.

The invention claimed is:

1. A display device, comprising:
a display panel; and
a light-emission board located on a non-display side of the display panel and stacked with the display panel, wherein
the light-emission board comprises a base substrate and a plurality of light-emission units provided on the base substrate, and a maximum size of at least one light-emission unit in a direction parallel to the base substrate is not greater than 3 mm;
connecting lines of centers of four immediately adjacent light-emission units in the plurality of light-emission units define a quadrangle; any two of the four light-emission units are immediately adjacent to each other; a connecting line of centers of two light-emission units that define the quadrangle and have a largest distance therebetween passes through two first points in edges, close to each other, of the two light-emission units; a distance between the two first points is a first distance D1; an included angle between an outermost light ray of light rays emitted by one of the light-emission units and a plane parallel to the base substrate is θ; and a minimum distance between surfaces, close to each other, of the display panel and the base substrate is not less than D1*tan θ/2.

2. The display device according to claim 1, wherein the quadrangle comprises a parallelogram.

3. The display device according to claim 1, wherein
at least part of the plurality of light-emission units are arranged in an array in a first direction and a second direction that intersects the first direction;
connecting lines of centers of two adjacent light-emission units arranged in the first direction and two light-emission units respectively adjacent to, the two adjacent light-emission units arranged in the first direction, in the second direction define the quadrangle, and an included angle between an edge of the quadrangle and the first direction or the second direction has a value in the range of −20° to 20°.

4. The display device according to claim 1, further comprising:
a light diffusion structure located between the light-emission board and the display panel and having a thickness of less than D1*tan θ/2 in a direction perpendicular to the base substrate, wherein
the light diffusion structure is spaced apart from the light-emission board; a line of the light-emission unit truncated by an extension line of a connecting line of the two first points has a size of L; a distance between a surface on a side, facing the light-emission board, of the light diffusion structure and a surface, facing the base substrate, of the light-emission unit is a second distance D2, and the second distance D2 meets:

$$D1*\tan\theta/2 < D2 < [(3*D1+2L)*\tan\theta]/2.$$

5. The display device according to claim 1, further comprising:
a light diffusion structure located between the light-emission board and the display panel and in direct contact with at least part of the light-emission units, wherein
the light-emission unit has a thickness H1 in a direction perpendicular to the base substrate, and a thickness H2 of the light diffusion structure meets:

$$D1*\tan\theta/2 - H1 \le H2 \le 5 \text{ mm}.$$

6. The display device according to claim 1, wherein the light-emission board comprises a first region and a second region located at a periphery of the first region; the light-emission units located in the first region are arranged in an array; in the second region, a connecting line of centers of one light-emission unit and any light-emission unit adjacent to the one light-emission unit passes through two second points in edges, close to each other, of the two light-emission units; and a distance between the two second points is smaller than the first distance.

7. The display device according to claim 6, wherein a ratio of the distance between the two second points in the second region to the first distance is 0.6 to 0.9.

8. The display device according to claim 3, wherein
the light-emission board comprises a plurality of light-emission-unit rows, each of which comprises at least two light-emission units arranged in the first direction;

the plurality of light-emission-unit rows are arranged in a direction perpendicular to the first direction; the first distance between the two light-emission units in an outermost light-emission-unit row and a light-emission-unit row adjacent to the outermost light-emission-unit row is smaller than the first distance between the two light-emission units in other two adjacent light-emission-unit rows; and/or the light-emission board comprises a plurality of light-emission-unit columns, each of which comprises at least two light-emission units arranged in the second direction; the plurality of light-emission-unit columns are arranged in a direction perpendicular to the second direction; the first distance between the two light-emission units in an outermost light-emission-unit column and a light-emission-unit column adjacent to the outermost light-emission-unit column is smaller than the first distance between the two light-emission units in other two adjacent light-emission-unit columns.

9. The display device according to claim 1, wherein a distance by which a connecting line of centers of any two adjacent light-emission units passes through two points in edges, close to each other, of the any two adjacent light-emission units is not smaller than a minimum distance between the light-emission unit that is outermost on the light-emission board and an edge of the light-emission board.

10. The display device according to claim 4, wherein a plurality of support portions are provided between the light-emission board and the light diffusion structure; connecting lines of the plurality of support portions define at least a first polygon and a second polygon parallel to the base substrate; the second polygon surrounds the first polygon; the first polygon comprises a plurality of first diagonal lines, while the second polygon comprises a plurality of second diagonal lines; at least two of the plurality of first diagonal lines pass through a geometrical center of the light-emission board, and/or at least two of the plurality of second diagonal lines pass through the geometrical center of the light-emission board; and a thickness of the support portion in the direction perpendicular to the base substrate is smaller than the second distance.

11. The display device according to claim 4, wherein a value of θ ranges from 20° to 30°, and a value of D1/L is 3 to 10.

12. The display device according to claim 5, wherein a line of the light-emission unit truncated by an extension line of a connecting line of the two first points has the size of L; a value of θ ranges from 10° to 25°, and the value of D1/L is 5 to 11.

13. The display device according to claim 10, wherein the light diffusion structure comprises a plurality of layers;

an area of one of the plurality of layers is S0, an area of the first polygon is S1, and an area of the second polygon is S2; and S0 and S1 meet: S0/S1≥16, and/or S0 and S2 meet: S0/S2≥2.

14. The display device according to claim 10, wherein a planar shape, parallel to the base substrate, of the display panel is a quadrangle; the planar shape of the display panel comprises two long edges and two short edges that are connected alternately;

an included angle between the longest one of the first diagonal lines passing through the geometrical center of the light-emission board and a straight line parallel to the long edges is a first included angle, and the first included angle is the smallest one of a plurality of included angles between the first diagonal lines passing through the geometrical center of the light-emission board and the straight line; and/or an included angle between the shortest one of the first diagonal lines passing through the geometrical center of the light-emission board and the straight line is a second included angle, and the second included angle is the largest one of the plurality of included angles between the first diagonal lines passing through the geometrical center of the light-emission board and the straight line.

15. The display device according to claim 10, wherein the light-emission board comprises a plurality of light-emission sub-boards; and at least one support portion is provided on each light-emission sub-board;

at least two support portions having an identical and minimum distance to the geometrical center are located on different light-emission sub-boards, respectively, and the at least two support portions constitutes at least one vertex of the first polygon; and at least one support portion provided on each light-emission sub-board constitutes a vertex of the second polygon.

16. The display device according to claim 15, wherein a plurality of reserved positions are provided at a side, facing the light diffusion structure, of each light-emission sub-board, and the support portion is provided at at least one reserved position on each light-emission sub-board;

the plurality of reserved positions on different light-emission sub-boards are the same in total number and relative positional relationship.

17. The display device according to claim 16, wherein a reflective film is provided between the base substrate and the light diffusion structure and comprises a plurality of first openings configured to expose at least part of the plurality of reserved positions;

the reflective film further comprises a plurality of second openings configured to expose at least part of the plurality of light-emission units.

18. The display device according to claim 17, wherein the reflective film comprises two reflective sub-films, a gap is between the two reflective sub-films and is covered with a reflective strip; or the reflective film comprises two reflective sub-films that partially overlap with each other.

19. The display device according to claim 15, wherein at least part of the plurality of light-emission units are arranged in an array in a first direction and a second direction that intersects the first direction;

the plurality of light-emission sub-boards are arranged in an array in the first direction and the second direction, and at least part of structures on the plurality of light-emission sub-boards are of centrosymmetric distribution with respect to the geometrical center; and the at least part of structures comprises the support portion and a driving circuit.

20. The display device according to claim 10, wherein at least two adjacent light-emission units constitute a light-emission-unit group, and the support portion is located between adjacent light-emission-unit groups.

* * * * *